(12) United States Patent
Sutanto et al.

(10) Patent No.: US 9,067,272 B2
(45) Date of Patent: Jun. 30, 2015

(54) SYSTEMS AND METHODS FOR HIGH ASPECT RATIO FLIP-CHIP INTERCONNECTS

(71) Applicant: Arizona Board of Regents, a body corporate of the State of Arizona Acting for and on behalf of Arizona State University, Scottsdale, AZ (US)

(72) Inventors: Jemmy Sutanto, Scottsdale, AZ (US); Jitendran Muthuswamy, Chandler, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 258 days.

(21) Appl. No.: 13/659,660

(22) Filed: Oct. 24, 2012

(65) Prior Publication Data
US 2013/0070436 A1    Mar. 21, 2013

Related U.S. Application Data

(63) Continuation-in-part of application No. PCT/US2011/040965, filed on Jun. 17, 2011.

(60) Provisional application No. 61/356,515, filed on Jun. 18, 2010, provisional application No. 61/551,097, filed on Oct. 25, 2011.

(51) Int. Cl.
*H05K 7/00* (2006.01)
*B23K 1/20* (2006.01)
(Continued)

(52) U.S. Cl.
CPC .. *B23K 1/20* (2013.01); *H05K 7/00* (2013.01);
*B23K 1/0008* (2013.01); *B23K 1/008* (2013.01); *B23K 3/0607* (2013.01);
(Continued)

(58) Field of Classification Search
CPC ............... H05K 7/00; B23K 1/20; B05D 5/10
USPC ............... 361/760; 427/207.1; 228/248.1
See application file for complete search history.

(56) References Cited

U.S. PATENT DOCUMENTS 5,052,338 A * 10/1991 Maiorca et al. ............... 118/668
6,621,155 B1    9/2003 Perino et al.
(Continued)

OTHER PUBLICATIONS

Witvrouw, CMOS-MEMS Integration: Why, How and What?. 2006, ICCAD '06 Proceedings of the 2006 IEEE/ACM international conference on Computer-aided design, pp. 826-827.
(Continued)

*Primary Examiner* — Timothy Thompson
*Assistant Examiner* — Charles Pizzuto
(74) *Attorney, Agent, or Firm* — Snell & Wilmer L.L.P.

(57) ABSTRACT

Interconnect and/or reflow methods of the present disclosure achieve high aspect ratio interconnects, for example interconnects having an aspect ratio as high as 4, in addition to wider interconnect height tolerances among interconnects (for example, interconnects having a height variability of up to about 30%) while still achieving reliable electrical connections. Moreover, flip-chip interconnects configured in accordance with principles of the present disclosure can provide improved z-axis spacing between die-to-die and/or die-to-substrate flip chip stacks, for example z-axis spacing as large as 600 μm. In this manner, additional spacing can be achieved for MEMS devices and/or similar components that are extendable and/or deformable out of the die plane.

13 Claims, 46 Drawing Sheets

(51) Int. Cl.
B05D 5/10 (2006.01)
B23K 1/00 (2006.01)
B23K 1/008 (2006.01)
B23K 3/06 (2006.01)
H01L 23/00 (2006.01)
H01L 25/065 (2006.01)

(52) U.S. Cl.
CPC .......... *B23K 3/0638* (2013.01); *B23K 2201/42* (2013.01); *H01L 2224/14155* (2013.01); *H01L 24/11* (2013.01); *H01L 24/13* (2013.01); *H01L 25/0657* (2013.01); *H01L 2224/1131* (2013.01); *H01L 2224/13339* (2013.01); *H01L 2224/48145* (2013.01); *H01L 2224/1329* (2013.01); *H01L 2924/10253* (2013.01); *H01L 2224/131* (2013.01); *H01L 2224/16145* (2013.01); *H01L 2924/1461* (2013.01)

(56) References Cited

U.S. PATENT DOCUMENTS

| | | | |
|---|---|---|---|
| 6,759,309 | B2 | 7/2004 | Gross |
| 7,619,305 | B2 | 11/2009 | Fan et al. |
| 2002/0106308 | A1* | 8/2002 | Zweifel et al. ................ 422/100 |
| 2005/0170627 | A1* | 8/2005 | Mowry et al. ................ 438/612 |
| 2009/0218668 | A1 | 9/2009 | Zhe et al. |
| 2010/0052162 | A1* | 3/2010 | Iijima ........................... 257/737 |
| 2010/0072626 | A1 | 3/2010 | Theuss et al. |
| 2010/0190294 | A1 | 7/2010 | Simmons-Matthews |

OTHER PUBLICATIONS

Chen et al., A novel plastic package for pressure sensors fabricated using the lithographic dam-ring approach. 2009, Sensors and Actuators A, vol. 149, pp. 165-171.
Pai et al., The viability of anisotropic conductive film as a flip chip interconnect technology for MEMS devices. 2005, J Micromech Microeng, vol. 15, pp. 1131-1139.
Candler et al., Single Wafer Encapsulation of MEMS Devices. 2003, IEEE Transactions on Advanced Packaging, vol. 26, pp. 227-232.
Ayanoor et al., Development of wafer scale encapsulation process for large displacement piezoresistive MEMS devices. 2009, Sensors and Actuators A, vol. 158, pp. 275-283.
Graham et al., A Method for Wafer-Scale Encapsulation of Large Lateral Deflection MEMS Devices. 2010, Journal of Microelectromechanical Systems, vol. 19, pp. 28-37.
Jackson et al., Nonhermetic Encapsulation Materials for MEMS-Based Movable Microelectrodes for Long-Term Implantation in the Brain. 2009, Journal of Microelectromechanical Systems, vol. 18, pp. 1234-1245.
O'Mahony et al., Wafer-level thin-film encapsulation for MEMS. 2009, Microelectronic Engineering, vol. 86, pp. 1311-1313.
Leroy et al., High Quality Factor Copper Inductors on Wafer-Level Quartz Package for RF MEMS Applications. 2006, Proceedings of the Solid-State Device Research Conference, pp. 190-193.
Ding et al., A Wafer-level Protective Technique Using Glass Caps for MEMS Gyroscopes. 2006, Solid-State and Integrated Circuit Technology, 8th International Conference on Shanghai, China, pp. 2129-2131.
Joseph et al., Through-silicon vias enable next-generation SiGe power amplifiers for wireless communications. 2008, IBM J Res Dev, vol. 52, pp. 635-648.
Boustedt, Flip Chip as an Enabler for MEMS Packaging. 2002, Electronic Components and Technology Conference, pp. 124-128.
Basavanhally et al., High-Density Solder Bump Interconnect for MEMS Hybrid Integration. 2007, IEEE Transactions on Advanced Packaging, vol. 30, pp. 622-628.
Yang et al., 3D Integration of CMOS and MEMS using Mechanically Flexible Interconnects (MFI) and Through Silicon Vias (TSV). 2010, Electronic Components and Technology Conference, pp. 822-828.

Zama et al., Flip Chip Interconnect Systems Using Copper Wire Stud Bump and Lead Free Solder. 2001, IEEE Transactions on Electonics Packaging Manufacturing, vol. 24, pp. 261-268.
Corbin, Finite element analysis for Solder Ball Connect (SBC) structural design optimization. 1993, Ibm J Res Dev, vol. 37, pp. 585-596.
Garrou, Wafer Level Chip Scale Packaging (WL-CSP): An Overview. 2000, IEEE Transactions on Advanced Packaging, vol. 23, pp. 198-205.
Zeng et al., Six cases of reliability study of Pb-free solder joints in electronic packaging technology. 2002, Materials Science and Engineering, vol. 38, pp. 1051-1059.
Zhang et al., An investigation into the effects of flux residues on properties of underfill materials for flip chip packages. 2003, IEEE T Compon Pack T, vol. 26, pp. 233-238.
Reichl et al., Overview and development trends in the field of MEMS packaging. 2001, Micro Electro Mechanical Systems, pp. 1-5.
Chen, Packaging effect investigation of WL-CSP with a central opening: A case study on pressure sensors. 2010, Sensors and Actuators A, vol. 157, pp. 47-53.
Maboudian et al., Self-assembled monolayers as anti-stiction coatings for MEMS: characteristics and recent developments. 2000, Sensors and Actuators, vol. pp. 219-223.
Spengen et al., A physical model to predict stiction in MEMS. 2002, J Micromech Microeng, vol. 12, pp. 702-713.
Cabruja et al., Piezoresistive Accelerometers for MCM-Package—Part II: The Packaging. 2005, J Microelectromech Systems, vol. 14, pp. 806-811.
Campabadal et al., Flip-chip packaging of piezoresistive pressure sensors. 2006, Sensors and Actuators A, vol. 132, pp. 415-419.
Stark et al., A Mold and Transfer Technique for Lead-Free Fluxless Soldering and Application to MEMS Packaging. 2006, J Microelectromech Systems, vol. 15, pp. 849-858.
Plaza et al., Piezoresistive Accelerometers for MCM Package. 2002, J Microelectromech Systems, vol. 11, pp. 794-801.
Miller et al., Microrelay Packaging Technology Using Flip-Chip Assembly. 2000, The 13th Annual International Conference on Micro Electro mechanical systems, pp. 265-270.
Lin et al., Study of Fluxless Soldering Using Formic Acid Vapor. 1999, IEEE Transactions on Advanced Packaging, vol. 22., pp. 592-601.
Heschel et al., Stacking Technology for a Space Constrained Microsystem. 1998, The 11th Annual International Workshop on Micro Electro Mechanical Systems, pp. 312-317.
Singh et al., Batch Transfer of Microstructures using Flip-Chip Solder Bump Bonding. 1997, International Conference on Solid State Sensors and Actuators, pp. 265-268.
Tilmans et al., A Fully-Packaged Electromagnetic Microrelay. 1999, Twelfth IEEE International Conference on Micro Electro Mechanical Systems, pp. 25-30.
Hettak et al., DC-to-50 GHz Compensation Structure for Flip-Chip Assembled SPST MEMS Switch. 2009, IEEE IMS, pp. 597-601.
Oh et al., A New Flip-chip Bonding Technique Using Micromachined Conductive Polymer Bumps. 1999, IEEE Transactions on Advanced Packaging, vol. 22, pp. 586-591.
Oh et al., Flip-Chip Packaging Using Micromachined Conductive Polymer Bumps and Alignment Pedestals for MOEMS. 1999, IEEE Journal of Selected Topics in Quantum Electronics, vol. 5, pp. 119-126.
Li et al., Polymer Flip-chip Bonding of Pressure Sensors on a Flexible Kapton Film for Neonatal Catheters. 2005, J Micromech Microeng, vol. 15, pp. 1729-1735.
Jeon et al., Mechanical Reliability Evaluation of Sn-37Pb Solder Joint Using High Speed Lap-shear Test. 2008, Microelectronic Engineering, vol. 85, pp. 1967-1970.
Ridout et al., Review of Methods to Predict Solder Joint Reliability Under Thermo-mechanical Cycling. 2007, Fatigue Fract Eng M, vol. 30, pp. 400-412.
Irwin et al., Quick Prototyping of Flip Chip Assembly with MEMS. 1998, IEEE, pp. 293-296.
Tuantranont et al., Bulk-etched Surface Micromachined and Flip-chip Integrated Micromirror Array for Infrared Applications. 2000, IEEE Optical MEMS, pp. 71-72.

(56) References Cited

OTHER PUBLICATIONS

Muthuswamy et al., Single Neuronal Recordings Using Surface Micromachined Polysilicon Microelectrodes. 2005, Journal of Neuroscience Methods, vol. 142, pp. 45-54.

Jackson et al., Long-term neural recordings using MEMS based movable microelectrodes in the brain. 2010, Frontiers in Neuroengineering, vol. 3, pp. 1-13.

Jackson et al., Flexible Chip-Scale Package and Interconnect for Implantable MEMS Movable Microelectrodes for the Brain. 2009, Journal of Microelectromechanical Systems, vol. 18.

Indium Inc. (Dec. 15, 2010). Solder Spheres. Available: http://www.indium.com/products/semiconductorpackagingassembly/solderspheres.php.

Vaynman et al., Isothermal Fatigue of Low Tin Lead Based Solder. 1988, Metall Trans a, vol. 19, pp. 1051-1059.

Abgrall et al., A Novel Fabrication Method of Flexible and Monolithic 3D Microfluidic Structures Using Lamination of SU-8 Films. 2006, J Micromech Microeng, vol. 16, pp. 113-121.

Lagally et al., Monolithic Integrated Microfluidic DNA Amplification and Capillary Electrophoresis Analysis System. 2000, Sensor Actuat B-Chem, vol. 63, pp. 138-146.

Goud et al., Electrochemical Biosensors and Microfluidics in Organic System-on-Package Technology. 2007, Electronic Components and Technology Conference, pp. 1550-1555.

Wu et al., Fabrication of complex three-dimensional microchannel systems in PDMS. 2003, J Am Chem Soc, vol. 125, pp. 554-559.

Martinez et al., Three-dimensional microfluidic devices fabricated in layered paper and tape. 2008, Proc Natl Acad Sci USA, vol. 105, pp. 19606-19611.

Notice of Allowance for U.S. Appl. No. 13/711,118 mailed Oct. 15, 2013.

Luharuka et al., Simulated and experimental dynamic response characterization of an electromagnetic microvalve. 2008, Sensor Actuat A-Phys, vol. 143, pp. 399-408.

Sutanto et al., Dynamic characteristics of membrane displacement of a bidirectional electromagnetic microactuator with microcoil fabricated on a single wafer. 2005, Microelectron Eng, vol. 82, pp. 12-27.

Gagnard et al., Through silicon via: From the CMOS imager sensor wafer level package to the 3D integration. 2010, Microelectron Eng, vol. 87, pp. 470-476.

Goldberg, How to understand MEMS. 2002, R&D Mag, vol. 44, pp. 37-37.

Sutanto et al., Novel First-Level Interconnect Techniques for Flip-chip on MEMS devices. 2012, J Microelectromechanical Systems, vol. 21., No. 1, pp. 132-144.

International Search Report and Written Opinion PCT/US2011/04096 dated Oct. 14, 2011.

International Preliminary Report on Patentability, PCT/US2011/040965 dated Dec. 19, 2012.

* cited by examiner

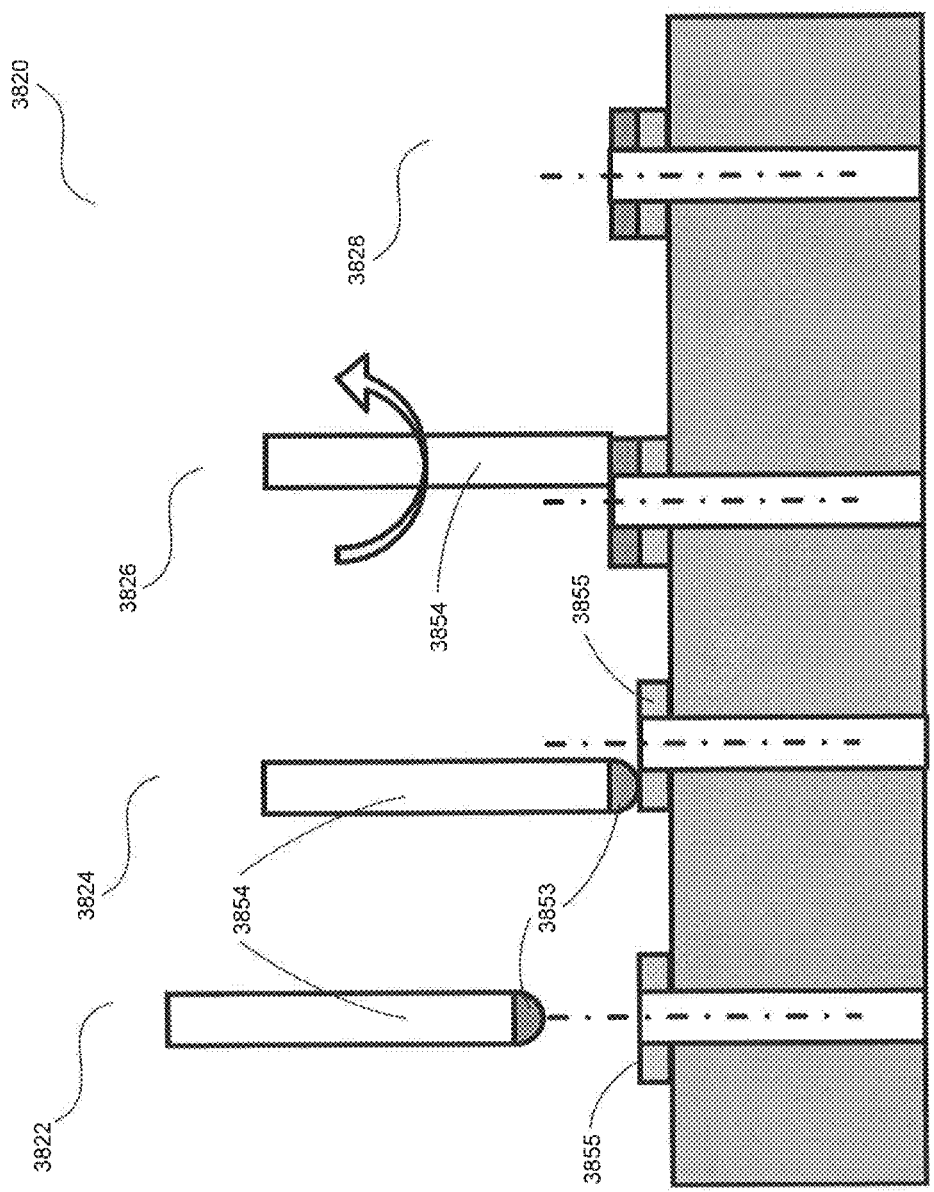

SYSTEMS AND METHODS FOR HIGH ASPECT RATIO FLIP-CHIP INTERCONNECTS

CROSS REFERENCE TO RELATED APPLICATIONS

This application is a non-provisional of U.S. Provisional No. 61/551,097 filed on Oct. 25, 2011 and entitled "SYSTEMS AND METHODS FOR ASPECT RATIO FLIP-CHIP INTERCONNECTS."

This application is also a continuation-in-part of PCT Application No. US2011/040965 having an international filing date of Jun. 17, 2011 and entitled "METHOD FOR CREATING AND PACKAGING THREE DIMENSIONAL STACKS OF BIOCHIPS CONTAINING MICROELECTRO-MECHANICAL SYSTEMS". PCT Application No. US2011/040965 claims priority to U.S. Provisional Application No. 61/356,515 filed on Jun. 18, 2010 and entitled "METHOD FOR CREATING AND PACKAGING THREE DIMENSIONAL STACKS OF BIOCHIPS CONTAINING MICROELECTRO-MECHANICAL SYSTEMS."

The entire contents of all the foregoing applications are hereby incorporated by reference.

FEDERALLY SPONSORED RESEARCH OR DEVELOPMENT

This invention was made with government support under grant number R01NS055312-03-S1 awarded by NIH/NINDS. The Government has certain rights in the invention.

TECHNICAL FIELD

The present disclosure relates to electronic circuits, for example circuits including MEMS devices, and in particular to interconnects for the same.

BACKGROUND

Microelectro-mechanical systems (MEMS) relate to technologies based on an integration of mechanical elements, such as sensors and actuators, and/or electronics that are formed on a common substrate by microfabrication technology. MEMS components range in size from a few microns to a few millimeters. MEMS components are fabricated by microfabrication techniques that include techniques used to fabricate integrated circuits (IC) using IC process sequences (e.g., CMOS, Bipolar, or BICMOS processes). Integrated circuit microfabrication techniques have been used to create three dimensional arrays of electrical components.

Micromechanical components of MEMS systems are fabricated using "micromachining" processes that selectively etch away parts of the silicon wafer or add new structural layers to form the mechanical and electromechanical devices. By combining silicon based microelectronics and micromachining. MEMS technology creates systems and devices in a single chip. MEMS augments the computational ability of microelectronics with the sensing and control functions of microsensors and/or microactuators.

It remains desirable to provide improved fabrication, packaging, and/or assembly processes for integrated circuits, particularly in connection with MEMS utilized in connection with flip-chip mounting approaches.

BRIEF DESCRIPTION OF THE DRAWINGS

With reference to the following description, appended claims, and accompanying drawings:

FIG. 38B illustrates a "dip and rotate" technique for microfluidic, electrical, and mechanical (MB3F) interconnects in accordance with an exemplary embodiment;

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the appended claims.

For the sake of brevity, conventional techniques for integrated circuit fabrication, packaging, processing, and the like, as well as MEMS fabrication, flip-chip interconnection, and the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical flip-chip interconnect method, reflow method, and/or the like.

In accordance with principles of the present disclosure, flip-chip interconnects and related methods, together with and/or in connection with modified reflow methods, can reduce flux contamination, reduce outgassing contamination, improve flip-chip processing yields, facilitate lower temperature flip-chip-processing, and/or create high aspect ratio interconnects.

In various exemplary embodiments, principles of the present disclosure are directed to clusters of microelectromechanical system (MEMS) components. In particular, the present disclosure concerns the configuration of a three dimensional stack of MEMS devices and a method of fabricating the stack. A specific application of principles of the present disclosure is a stack of movable microelectrodes that may be positioned within a brain so that the microelectrodes sense electrical impulses of single neurons and neuronal networks and transmit signals created by those electrical impulses for recording.

Principles of the present disclosure are described hereinafter by reference to the accompanying drawings that show embodiments of principles of the present disclosure and in which like numbers refer to like elements throughout. Principles of the present disclosure may, however, be embodied in many different forms and should not be construed as limited to the embodiments set forth herein. Rather, these embodiments are examples of principles of the present disclosure.

Figure 1:
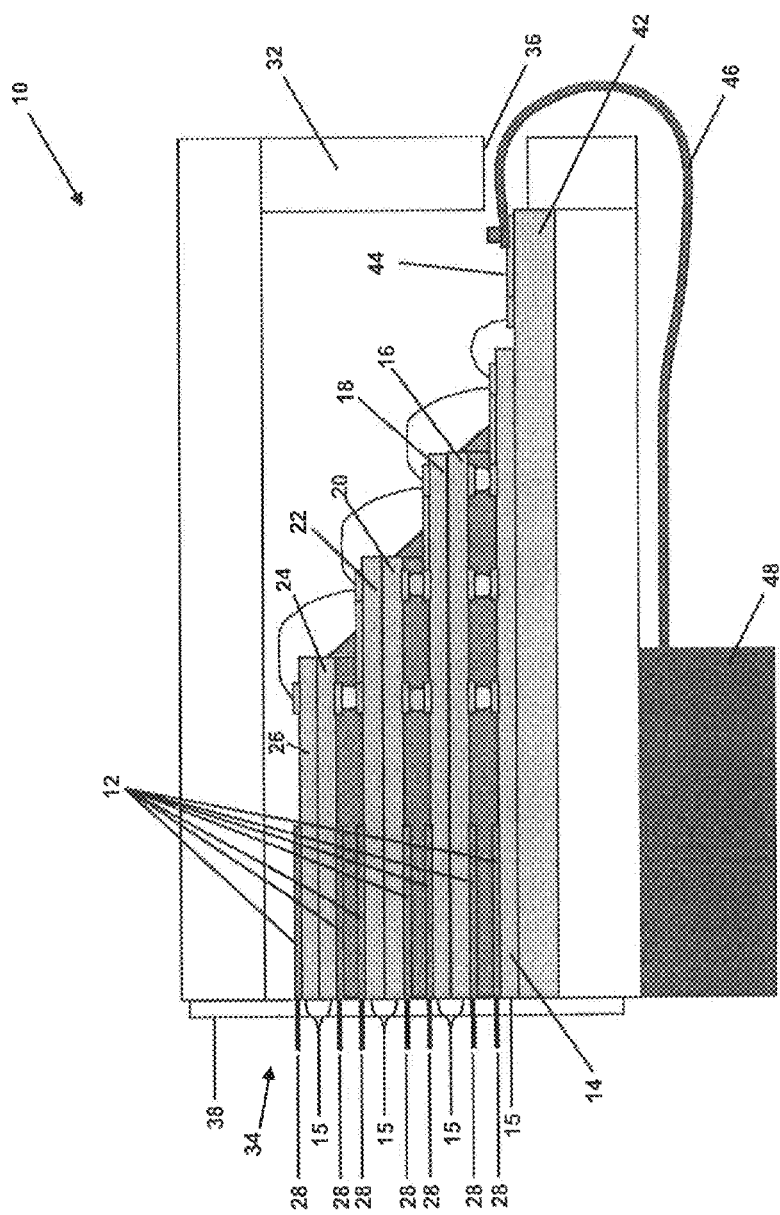
FIG. 1 illustrates a side cross section of a microsensor cluster in accordance with an exemplary embodiment.

FIG. 1 illustrates a cross section of a microsensor cluster 10 according to an exemplary embodiment. The cluster 10 includes seven MEMS active microactuators 12. Each microactuator 12 is formed on one of seven silicon substrates 14, 16, 18, 20, 22, 24 and 26. The silicon substrates 14, 16, 18, 20, 22, 24 and 26 each has a thickness that provides sufficient strength to support the microactuator 12 when assembled within the cluster 10 as described herein. In an exemplary embodiment, the thickness of the silicon substrates may be one half millimeter thick, although any suitable thickness may be utilized. The substrates 14, 16, 18, 20, 22, 24 and 26 each have a leading edge 15. The substrates 14, 16, 18, 20, 22,

24 and 26 are positioned generally parallel to each other and so that their leading edges 15 lie approximately in a plane.

A microactuator 12 is formed on each substrate 14, 16, 18, 20, 22, 24 and 26. Each microactuator 12 extends on a substrate from the edge 15. A plurality of microelectrodes 28 extend away from each microactuator 12 along the edge 15. The microelectrodes 28 extend generally perpendicular to the edge 15 and generally perpendicular to the plane approximated by the edges 15 of the substrates 14, 16, 18, 20, 22, 24 and 26. The microelectrodes 28 are movably mounted to the microactuators 12. The microactuators 12 are constructed to support and to extend and retract the microelectrodes 28.

The microsensor cluster 10 is positioned within a cover 32. The cover 32 defines an interior and an opening 34. The microcluster 10 is positioned within the interior of the cover 32 so that the edges 15 of the substrates 14, 16, 18, 20, 22, 24 and 26 are at the opening 34. The microelectrodes 28 extend from the microactuators 12 at the opening 34. A non-hermetic mesh encapsulation 38 is secured to the cover 32 to extend over the opening 34. The mesh encapsulation 38 permits the microelectrodes 28 to extend therethrough. In an exemplary embodiment, the mesh is a composite of nylon mesh with silicon gel encapsulation as described by N. Jackson, S. Anand, I. Okandan and J. Muthuswamy, "Non-hermetic Encapsulation Materials for MEMS Based Moveable Microelectrodes for Long-Term Implantation in the Brain," IEEE/ASME J. Microelectromech Syst, 18 (6):1234-1245, 2009.

The microsensor cluster 10 includes a second level interconnect board 42 that is mounted to the cover 32. The second level interconnect board 42 may be made of glass or polyimide and may be one half millimeter thick. The second level interconnect board 42 has connection pads 44 adjacent to the cover 32 at a location that is separated from the opening 34. The connection pads 44 are electrically connected to the microelectrodes 28 and to the microactuators 12 as further described herein. Signals from the microelectrodes 28 are received by the connection pads 44 that are electrically connected thereto, and the microelectrodes 28 and the microactuators 12 are controlled by signals provided to connection pads 44 that are electrically connected to the microactuators 12. Conductors 46 are electrically connected to the connection pads 44 and extend through the opening 36 in the cover 32 to an outer connect 48 at which electrical connections to the microelectrodes 28 and the microactuators 12 may be made.

The substrate 14 is mounted to the second level interconnect board 42 as will be described herein. The substrate 16 is mounted to the substrate 14 as will be described herein. The substrate 16 is spaced from the substrate 14 by approximately 60 micrometers. The microactuator 12 mounted to the substrate 14 is positioned on a surface of the substrate 14 that faces the substrate 16. The microactuator 12 mounted to the substrate 16 is positioned on a surface of the substrate 16 that faces the substrate 14. The microactuators 12 mounted to the substrates 14 and 16 are thereby positioned adjacent to and separated from each other within the space separating the substrates 14 and 16.

The substrate 18 overlies and is mounted to the substrate 16 as will be described herein. The substrate 20 is mounted to the substrate 18 as will be described herein. The substrate 20 is spaced from the substrate 18 by approximately 60 micrometers. The microactuator 12 mounted to the substrate 20 is positioned on a surface of the substrate 20 that faces the substrate 18. The microactuator 12 mounted to the substrate 18 is positioned on a surface of the substrate 18 that faces the substrate 20. The microactuators 12 mounted to the substrates 16 and 18 are thereby separated from each other by the substrates 16 and 18 and by the bonding between them. The microactuators 12 mounted to the substrates 18 and 20 are thereby positioned adjacent to and separated from each other within the space separating the substrates 18 and 20.

The substrate 22 overlies and is mounted to the substrate 20 as will be described herein. The substrate 24 is mounted to the substrate 22 as will be described herein. The substrate 24 is spaced from the substrate 22 by approximately 60 micrometers. The microactuator 12 mounted to the substrate 24 is positioned on a surface of the substrate 24 that faces the substrate 22. The microactuator 12 mounted to the substrate 22 is positioned on a surface of the substrate 22 that faces the substrate 24. The microactuators 12 mounted to the substrates 20 and 22 are thereby separated from each other by the substrates 20 and 22 and the bonding between them. The microactuators 12 mounted to the substrates 22 and 24 are thereby positioned adjacent to and separated from each other within the space separating the substrates 22 and 24.

The substrate 26 overlies and is mounted to the substrate 24 as will be described herein. The microactuator 12 mounted to the substrate 26 is positioned on a surface of the substrate 26 that faces away from the substrate 24. The microactuators 12 mounted to the substrates 24 and 26 are thereby separated from each other by the substrates 24 and 26 and by the bonding between them.

Figure 2:
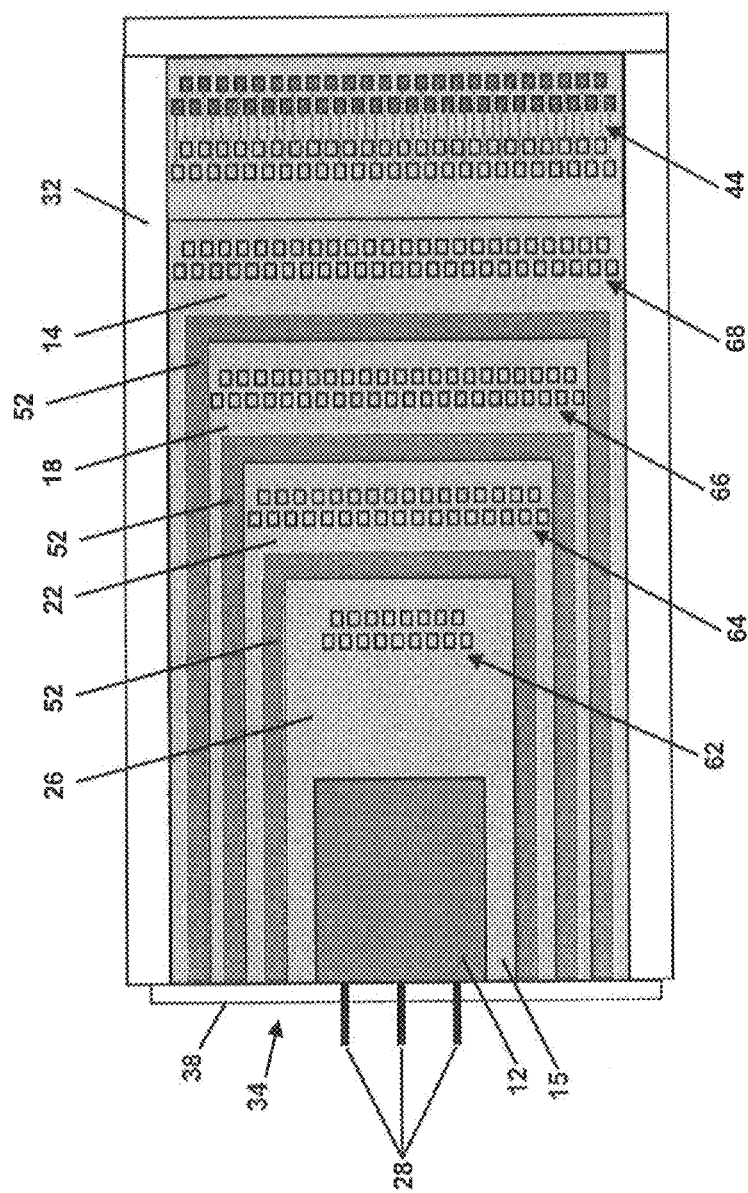
FIG. 2 illustrates a section view of the top of a microsensor cluster in accordance with an exemplary embodiment.

FIG. 2 is a view of the microsensor cluster 10 from adjacent to substrate 26. The cover 32 and mesh encapsulation 38 are shown in section. Three microelectrodes 28 are shown extending from the microactuators 12 at separated locations along the edge 15. An underfill material 52 closes and hermetically seals the gap between substrate 24 and substrate 22 around the periphery of the substrate 24 except the periphery that lies along the leading edge 15. Similarly, the underfill material 52 closes and hermetically seals the gap between substrate 20 and substrate 18 around the periphery of the substrate 20 except the periphery that lies along the leading edge 15. The underfill material 52 also closes and hermetically seals the gap between substrate 16 and substrate 14 around the periphery of the substrate 16 except the periphery that lies along the leading edge 15. As presently preferred, the underfill material is a silicon epoxy that is manufactured by DAP Products Inc. The underfill material 52 supports the substrates maintaining the separation between separated substrates.

As shown by FIG. 2, a plurality of connection pads 62 are positioned on an outward facing surface of the substrate 26 that faces oppositely from the substrate 24. These connection pads 62 are electrically connected to the actuator 12 that is on the substrate 26 and the microelectrodes 28 that extend from that actuator 12. Those electrical connections may comprise any electrical connection including conductive paths formed in the substrate 26 by integrated circuit (IC) processes.

A plurality of connection pads 64 are positioned on a section of the substrate 22 that extends farther from the leading edge 15 than do substrates 24 and 26. The pads 64 are positioned on a surface of the substrate 22 that faces oppositely from the substrate 20. Connection pads 64 are electrically connected to the actuator 12 that is on the substrate 22 and the microelectrodes 28 that extend from that actuator 12. Others of connection pads 64 are electrically connected to the actuator 12 that is on the substrate 24 and the microelectrodes 28 that extend from that actuator 12. Those electrical connections include connections from the substrate 24 to the substrate 22 as described herein.

A plurality of connection pads 66 are positioned on a section of the substrate 18 that extend farther from the leading edge 15 than do substrates 20 and 22. The pads 66 are positioned on a surface of the substrate 18 that faces oppositely from the substrate 16. Connection pads 66 are electrically connected to the actuator 12 that is on the substrate 18 and the microelectrodes 28 that extend from that actuator 12. Others of connection pads 66 are electrically connected to the actuator 12 that is on the substrate 20 and the microelectrodes 28 that extend from that actuator 12. Those electrical connections include connections from the substrate 20 to the substrate 18 as described herein.

A plurality of connection pads 68 are positioned on a section of the substrate 14 that extend farther from the leading edge 15 than do substrates 16 and 18. The pads 68 are positioned on a surface that faces oppositely from the interconnect board 42. Connection pads 68 are electrically connected to the actuator 12 that is on the substrate 14 and the microelectrodes 28 that extend from that actuator 12. Others of connection pads 68 are electrically connected to the actuator 12 that is on the substrate 16 and the microelectrodes 28 that extend from that actuator 12. Those electrical connections include connections from the substrate 16 to the substrate 14 as described herein.

In an exemplary embodiment, the connection pads can be aluminum or doped polysilicon and are fabricated along with the other microstructures on each substrate. In general, they can be made out of any conductive film. Typical industrial standard is copper or gold as these metals adhere well with solder paste.

As illustrated by FIG. 2, the substrates 26 and 24 have the same dimension along the leading edge 15, the width, and the same dimension along the plane of the substrates 26 and 24 in the direction perpendicular to the leading edge, the length. For the embodiment illustrated, the width of substrates 26 and 24 is approximately 3 millimeters, and the length is approximately 5 millimeters. The substrates 22 and 20 both have a width of approximately 4 millimeters and a length of approximately 6.5 millimeters. The substrates 18 and 16 both have a width of approximately 5 millimeters and a length of approximately 8 millimeters. The substrate 14 has a width of approximately 6 millimeters and a length of approximately 9.5 millimeters. All substrates support a microactuator 12 to which forces are applied when the microelectrodes 28 are extended or retracted.

Figure 3:
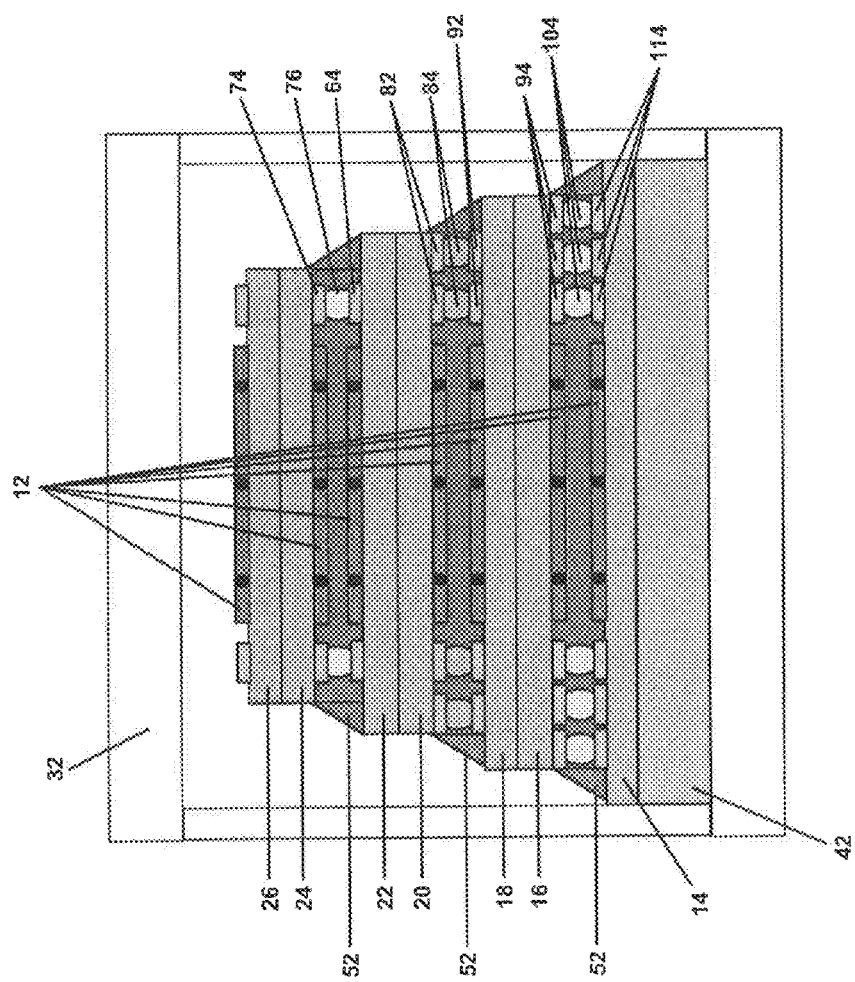
FIG. 3 illustrates an end view of a microsensor cluster in accordance with an exemplary embodiment.

FIG. 3 shows the microsensor cluster 10 from the opening 34 in the cover 32. As shown by FIG. 3, substrate 14 includes three mounting pads 114 on the surface facing substrate 16 on opposed sides in the width direction from the microactuator 12 mounted on the substrate 14. The mounting pads 114 are spaced between the microactuator 12 and the extent of the substrate 14 in the width direction. Mounting pads 94 on the surface of substrate. 16 are adjacent to and spaced from the mounting pads 114. Solder 114 adheres to opposed pairs of mounting pads 114 and 94 and spaces the substrate 16 from the substrate 14. Substrate 18 includes two mounting pads 92 on the surface facing substrate 18 on opposed sides in the width direction from the microactuator 12 mounted on the substrate 18. The mounting pads 92 are spaced between the microactuator 12 and the extent of the substrate 18 in the width direction. Mounting pads 82 on the surface of substrate 20 are adjacent to and spaced from the mounting pads 92. Solder 84 adheres to opposed pairs of mounting pads 82 and 92 and spaces the substrate 20 from the substrate 18. One of the pads 64 on the surface of substrate 22 facing substrate 24 is located on each of the opposed sides in the width direction from the microactuator 12 mounted on the substrate 22. Those pads 64 are spaced between the microactuator 12 and the extent of the substrate 22 in the width direction. Pads 74 on the surface of substrate 24 are adjacent to and spaced from the pads 64 that are outwardly adjacent to the microactuator 12 on the substrate 24. Solder 76 adheres to opposed pairs of pads 64 and 74 and spaces the substrate 24 from the substrate 22.

The substrates 14, 16, 18, 20, 22, 24 and 26 are mounted as described below to provide support to the substrates to prevent deflection of the substrates and unacceptable movement of the microactuators 12 and microelectrodes 28, and to avoid stress in the substrates that will damage or cause the substrate to fail.

Figure 4:
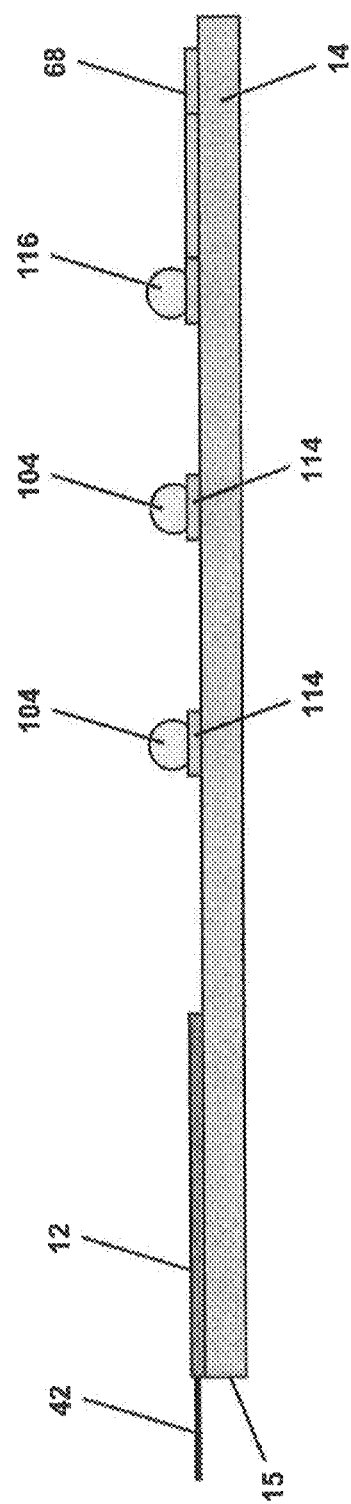
FIG. 4 illustrates the assembly created by the first step of assembly of a microsensor cluster in accordance with an exemplary embodiment.

FIG. 4 illustrates the assembly of the first step in assembling the microsensor cluster 10. The substrate 14 is fabricated with the microactuator 12 and microelectrodes 28 on a surface of the substrate 14, two rows of mounting pads 114 on that surface extending along the width direction of the substrate 14 and the pads 68 on that surface. The two rows of mounting pads 114 are spaced from each other along the length direction of the substrate 14 and spaced from the pads 68. Signals from the microelectrodes 28 that extend from the microactuator 12 that is on the substrate 14 are received by connection pads 68 that are electrically connected to those microelectrodes 28. The microactuator 12 that is on the substrate 14 is controlled by signals provided to connection pads 68 that are electrically connected to that microactuator 12. The first step of assembly of microsensor cluster 10 comprises applying solder 104 to the pads 114 and solder 116 to pads 68. Solder is composed of flux and solder particulates, with the size of 5 to 15 µm; as typically used in the industry a 50:50 composition by volume between solder particulates and flux. Solder particulate composition is determined by what is commercially available.

Figure 5:
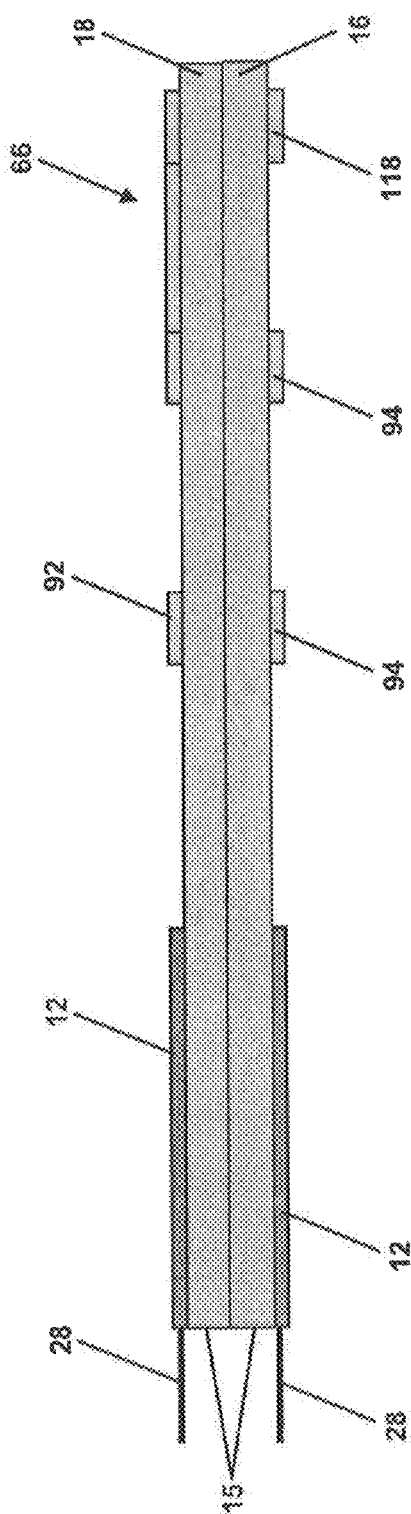
FIG. 5 illustrates the assembly created by the second step of assembly of a microsensor cluster in accordance with an exemplary embodiment.

FIG. 5 illustrates the assembly created by the second step in assembling the microsensor cluster 10. The substrate 16 is fabricated with the microactuator 12 and microelectrodes 28 on a surface of the substrate 16, with two rows of mounting pads 94 extending along the width direction on that surface of the substrate 16 and with connection pads 118 on that surface. The two rows of mounting pads 94 are spaced from the leading edge 15 of the substrate 16 by the same distance that the rows of mounting pads 114 are spaced from the leading edge 15 of the substrate 14. As illustrated in FIG. 3, the pads 94 are spaced along the width direction of the substrate 16 to be adjacent to the mounting pads 114 on the substrate 14 when the substrate 16 is positioned adjacent to the substrate 14. The connection pads 118 on the substrate 16 are electrically connected to the microactuator 12 that is on the substrate 16 and to the microelectrodes 28 that extend from that microactuator 12. Signals from the microelectrodes 28 may be received by the connection pads 118 that are electrically connected to and the microelectrodes 28. The microactuator 12 on the substrate 16 may be controlled by signals provided to connection pads 118 that are electrically connected to that microactuator 12.

The substrate 18 is fabricated with the microactuator 12 and microelectrodes 28 on a surface of the substrate 18, a row of mounting pads 92 extends along the width direction on that surface of the substrate 18 and with connection pads 66 on that surface. The row of mounting pads 92 is separated from the leading edge 15 of the substrate 18 by the distance that separates the row of mounting pads 94 on the substrate 14 that is closest to the leading edge 15 of that substrate from the leading edge 15. The connection pads 66 are electrically connected to the microactuator 12 that is on the substrate 18 and to the microelectrodes 28 that extend from that microactuator 12. Signals from the microelectrodes 28 may be received by the connection pads 66 that are electrically connected to and the microelectrodes 28. The microactuator 12 on the substrate 18 may be controlled by signals provided to connection pads 118 that are electrically connected to that microactuator 12.

The substrates 16 and 18 are sized to have the same length and width. The second step of assembly of microsensor cluster 10 comprises positioning the substrates 16 and 18 adjacent to each other so that the leading edges 15 of the substrates 16 and 18 are adjacent to each other and a surface of each substrate that is opposed to the surface on which the microactuators 12 and pads are located abuts such an opposed surface of the other substrate. As illustrated in FIG. 5, in this position, the row of mounting pads 92 nearest the leading edges 15 is adjacent to the row of mounting pads 94 that is nearest those leading edges, the row of mounting pads 94 that is farther from the leading edges 15 and the row of connection pads 118 are adjacent to the connection pads 66. The second step of assembly of microsensor cluster 10 further comprises eutectic bonding of the substrates 16 and 18 to each other at the abutting surfaces.

Figure 6:
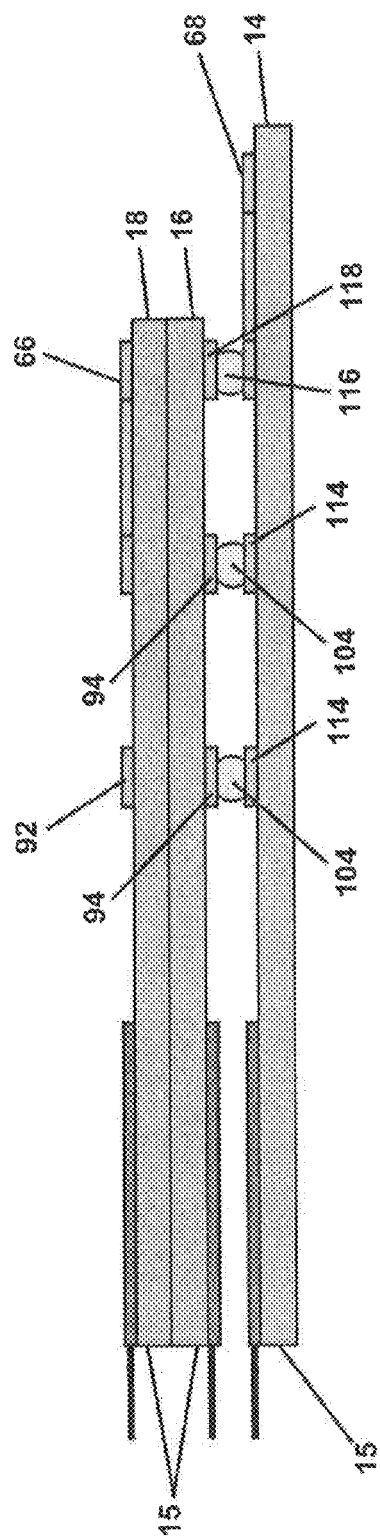
FIG. 6 illustrates the assembly created by the third step of assembly of a microsensor cluster in accordance with an exemplary embodiment.

FIG. 6 illustrates the assembly of the third step in assembling the microsensor cluster 10. The bonded substrates 16 and 18 are positioned adjacent to the substrate 14 so that the leading edges 15 of the substrates 14, 16 and 18 lie approximately in a plane and the surface of the substrate 16 on which the microactuator 12 and pads 94 and 118 are positioned overlies the surface of the substrate 14 on which the microactuator 12 and pads 114 and 68 are positioned. The mounting pads 94 are positioned adjacent to the solder 104 on the mounting pads 114 and the connection pads 118 are positioned adjacent to the solder 116 on the connection pads 68. The solder 104 and 116 bond the substrate 14 to the substrate 16 and reflow soldering creates a solder connection between mounting pads 94 and 104 and between connection pads 118 and 68.

In an exemplary embodiment, solder used in connection with principles of the present disclosure is manufactured by Indium Corporation and is 63 Sn and 37 Ph solder. As discussed in additional detail herein, a slow reflow process may be utilized wherein the melting temperature is approached over about 60 to about 80 minutes. Slow heating allows flux to evaporate, reducing and/or eliminating contamination of the active MEMS components, for example microactuators 12 and microelectrodes 28, by the flux (which can interfere with functioning of the MEMS components).

Figure 7:
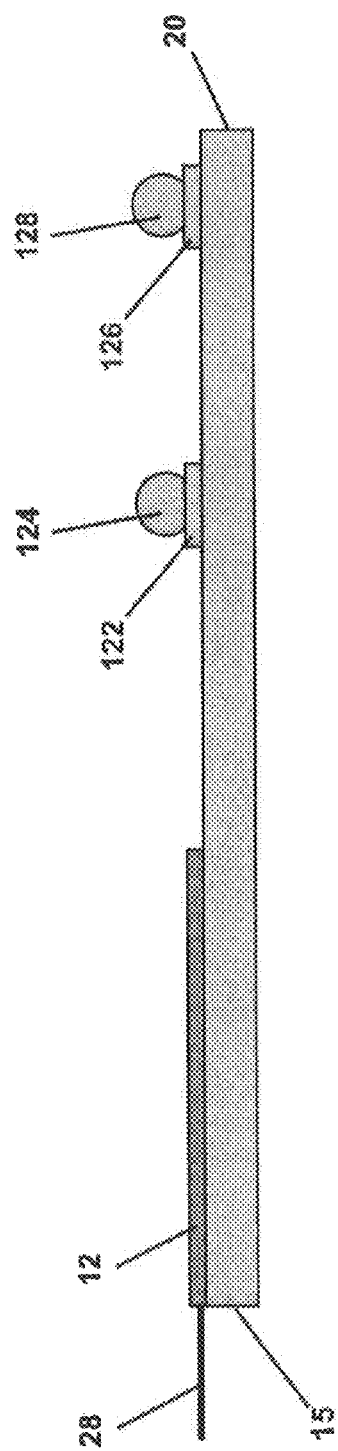
FIG. 7 illustrates the assembly created by the fourth step of assembly of a microsensor cluster in accordance with an exemplary embodiment.

FIG. 7 illustrates the assembly of the fourth step in assembling the microsensor cluster 10. The substrate 20 is fabricated with the microactuator 12 and microelectrodes 28 on a surface of the substrate 20, with a row of mounting pads 122 on that surface extending along the width direction of the substrate 20 and a row of connection pads 126 extending along the width direction of the substrate 20. The row of mounting pads 122 is separated from the leading edge 15 of the substrate 20 by the same distance that the mounting pads 92 are separated from the leading edge 15 of the substrate 18. The connection pads 126 are separated from the leading edge 15 of the substrate 20 by a distance that is approximately the distance that the connection pads 66 are separated from the leading edge 15 of the substrate 18. The row of mounting pads 122 and the row of connection pads 126 are spaced from each other along the length direction of the substrate 20. Signals from the microelectrodes 28 that extend from the microactuator 12 that is on the substrate 20 are received by connection pads 126 that are electrically connected to those microelectrodes 28 and the microactuator 12 that is on the substrate 20 is controlled by signals provided to connection pads 126 that are electrically connected to that microactuator 12. The fourth step of assembly of microsensor cluster 10 comprises applying solder 124 to each of the mounting pads 122 and applying solder 128 to each of the connection pads 126.

Figure 8:
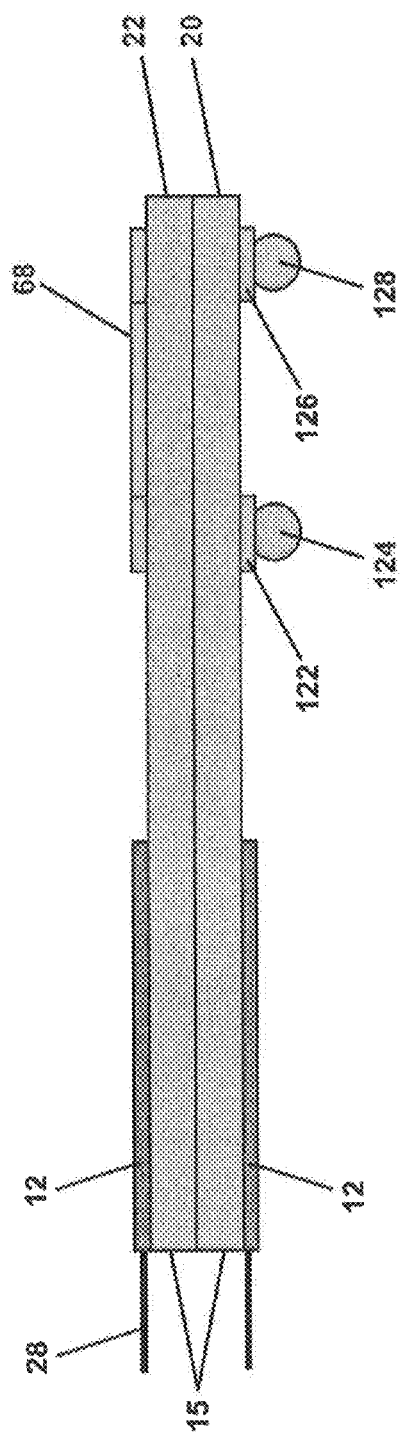
FIG. 8 illustrates the assembly created by the fifth step of assembly of a microsensor cluster in accordance with an exemplary embodiment.

FIG. 8 illustrates the assembly of the fifth step in assembling the microsensor cluster 10. The substrate 22 is fabricated with the microactuator 12 and microelectrodes 28 on a surface of the substrate 22 with connection pads 68 on that surface and separated from the leading edge 15 of the substrate 22. The connection pads 68 are electrically connected to the microactuator 12 that is on the substrate 22 and to the microelectrodes 28 that extend from that microactuator 12. Signals from the microelectrodes 28 may be received by the connection pads 68 that are electrically connected to the microelectrodes 28. The microactuators 12 on the substrate 22 may be controlled by signals provided to connection pads 68 that are electrically connected to that microactuator 12.

The substrates 20 and 22 are sized to have the same length and width. The fifth step of assembly of microsensor cluster 10 comprises positioning the substrates 20 and 22 adjacent to each other so that a surface of each substrate that is opposed to the surface on which the microactuators 12 and pads are located abuts such an opposed surface of the other substrate. The fifth step of assembly of microsensor cluster 10 further comprises eutectic bonding of the substrates 20 and 22 to each other at the abutting surfaces.

Figure 9:
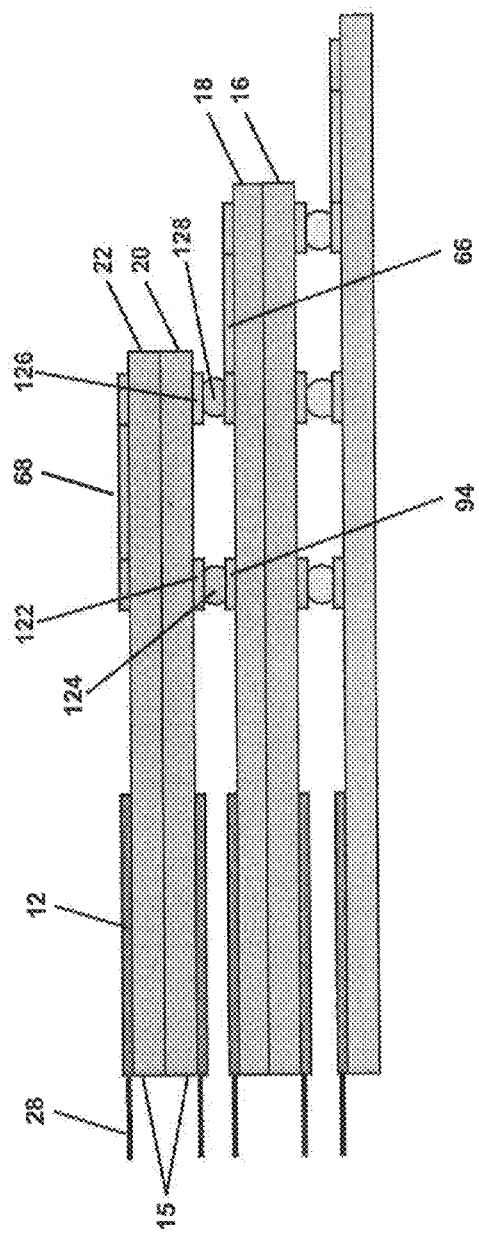
FIG. 9 illustrates the assembly created by the sixth step of assembly of a microsensor cluster in accordance with an exemplary embodiment.

FIG. 9 illustrates the assembly of the sixth step in assembling the microsensor cluster 10. The bonded substrates 20 and 22 are positioned adjacent to the substrate 18 so that the leading edges 15 of the substrates 18, 20 and 22 lie approximately in a plane and the surface of the substrate 20 on which the microactuator 12 and pads 122 and 126 are positioned overlies the surface of the substrate 18 on which the microactuator 12 and pads 94 and 66 are positioned. The mounting pads 122 are positioned adjacent to the mounting pads 94 capturing the solder 124 therebetween and the connection pads 126 are positioned adjacent to connection pads 66 capturing the solder 128 therebetween. The substrate 20 is bonded to the substrate 18 by reflow soldering as described herein.

Figure 10:
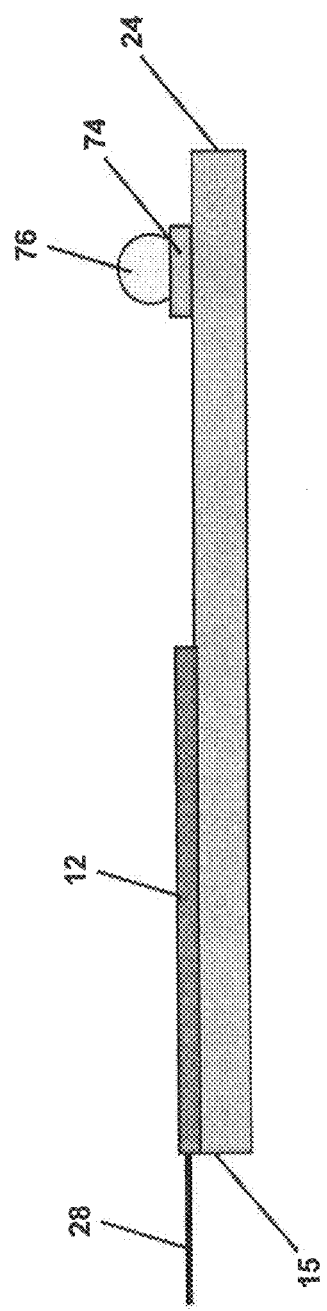
FIG. 10 illustrates the assembly created by the seventh step of assembly of a microsensor cluster in accordance with an exemplary embodiment.

FIG. 10 illustrates the assembly of the seventh step in assembling the microsensor cluster 10. The substrate 24 is fabricated with the microactuator 12 and microelectrodes 28 on a surface of the substrate 24, with a row of connection pads 74 extending along the width direction of the substrate 24. The connection pads 74 are separated from the leading edge 15 of the substrate 24 by a distance that is approximately the distance that the connection pads 68 are separated from the leading edge 15 of the substrate 22. Signals from the microelectrodes 28 that extend from the microactuator 12 that is on the substrate 24 are received by connection pads 74 that are electrically connected to those microelectrodes 28 and the microactuator 12 that is on the substrate 24 is controlled by signals provided to connection pads 74 that are electrically connected to that microactuator 12. The seventh step of assembly of microsensor cluster 10 comprises applying solder 76 to each of the connection pads 74.

Figure 11:
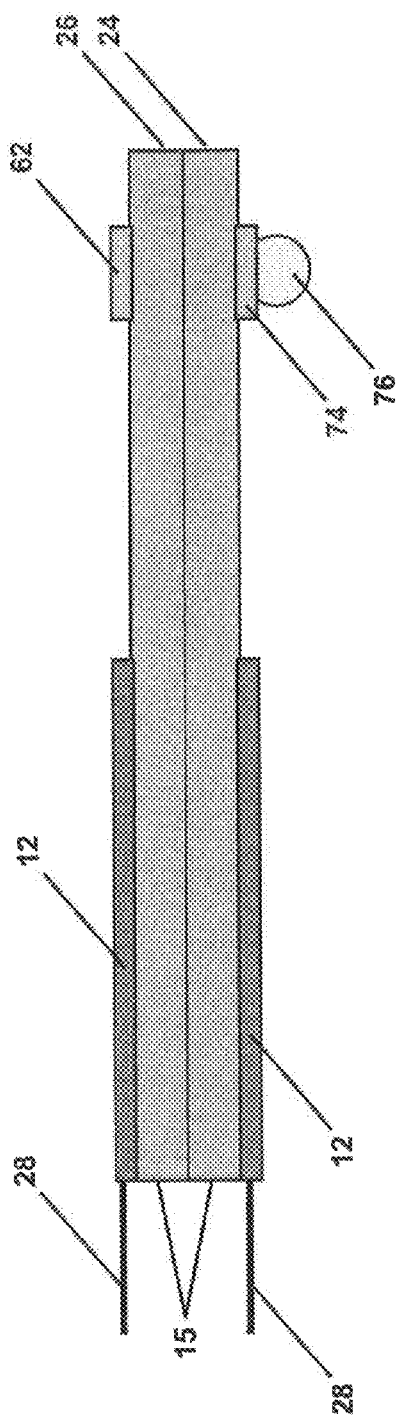
FIG. 11 illustrates the assembly created by the eighth step of assembly of a microsensor duster in accordance with an exemplary embodiment.

FIG. 11 illustrates the assembly of the eighth step in assembling the microsensor cluster 10. The substrate 26 is fabricated with the microactuator 12 and microelectrodes 28 on a surface of the substrate 26 with connection pads 62 on that surface and separated from the leading edge 15 of the substrate 26. The connection pads 66 are electrically connected to the microactuator 12 that is on the substrate 26 and to the microelectrodes 28 that extend from that microactuator 12. Signals from the microelectrodes 28 may be received by the connection pads 66 that are electrically connected to the microelectrodes 28. The microactuator 12 on the substrate 22 may be controlled by signals provided to connection pads 66 that are electrically connected to that microactuator 12.

The substrates 24 and 26 are sized to have the same length and width. The eighth step of assembly of microsensor cluster 10 comprises positioning the substrates 24 and 26 adjacent to each other so that a surface of each substrate that is opposed to the surface on which the microactuators 12 and connection pads are located abuts such an opposed surface of the other substrate. The eighth step of assembly of microsensor cluster 10 further comprises eutectic bonding of the substrates 24 and 26 to each other at the abutting surfaces.

Figure 12:
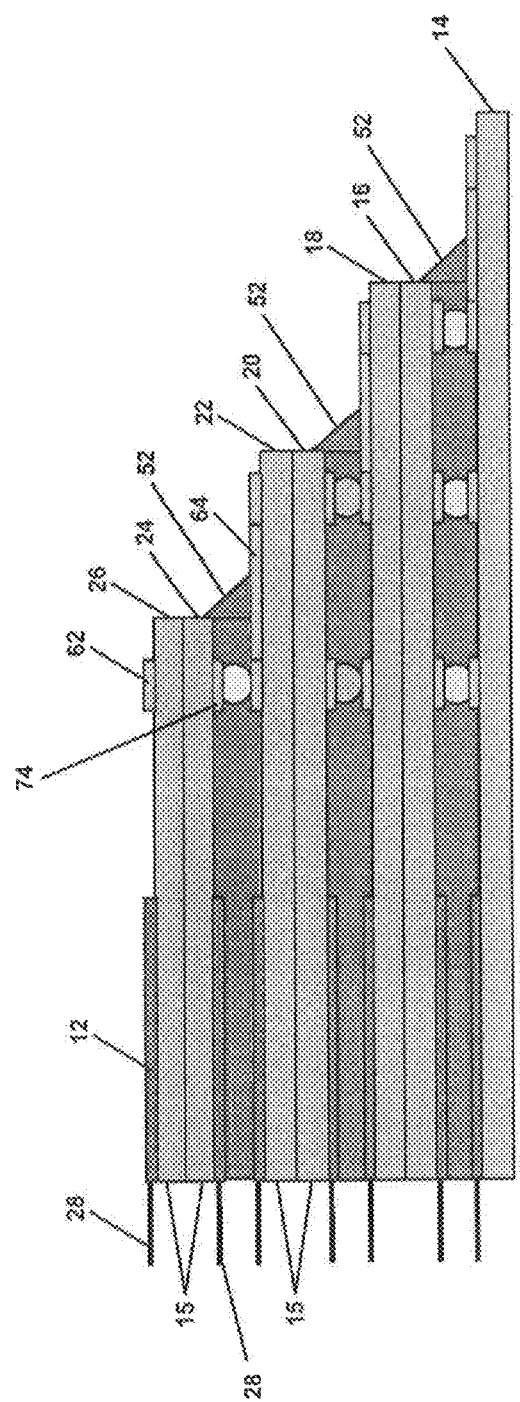
FIG. 12 illustrates the assembly created by the ninth step of assembly of a microsensor cluster in accordance with an exemplary embodiment.

FIG. 12 illustrates the assembly of the ninth step in assembling the microsensor cluster 10. The bonded substrates 24 and 26 are positioned adjacent to the substrate 22 so that the leading edges 15 of the substrates 22, 24 and 26 lie approximately in a plane and the surface of the substrate 24 on which the microactuator 12 and connection pads 74 are positioned overlies the surface of the substrate 22 on which the microactuator 12 and connection pads 64 are positioned. The connection pads 74 are positioned adjacent to connection pads 64 capturing the solder 76 therebetween. The substrate 24 is bonded to the substrate 22 by reflow soldering as described herein. The ninth step in assembling the microsensor cluster 10 further comprises applying the silicon epoxy underfill material 52 as described above. The silicon epoxy underfill material 52 is allowed to dwell for 18 hours to assure that it is solid.

Figure 13:
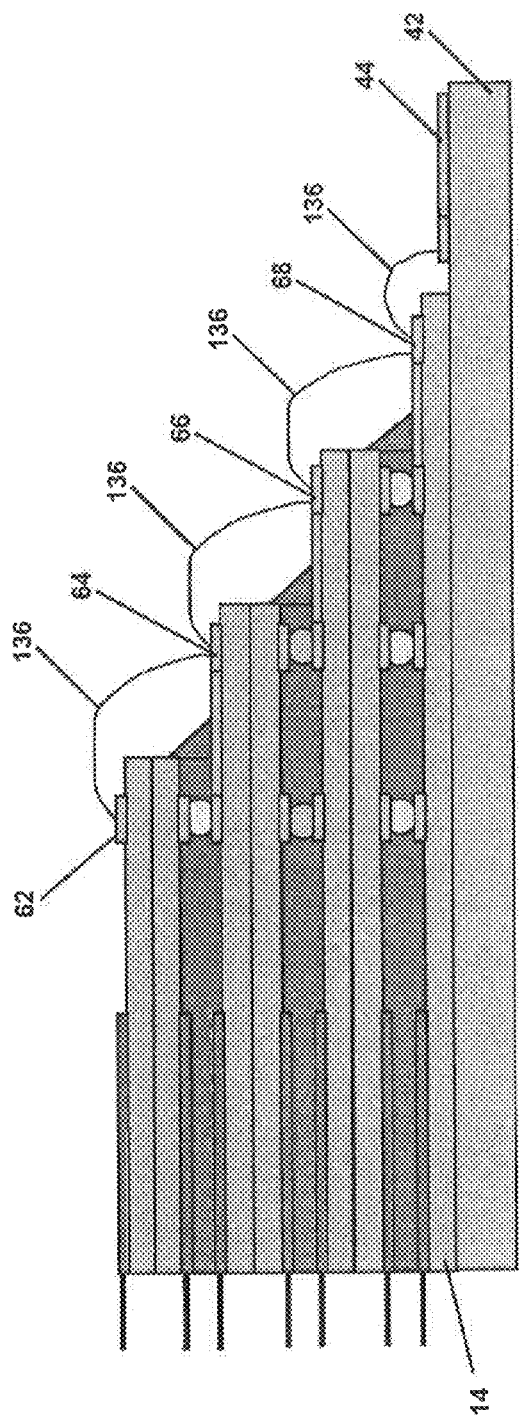
FIG. 13 illustrates the assembly created by the tenth step of assembly of a microsensor cluster in accordance with an exemplary embodiment.

FIG. 13 illustrates the assembly of the tenth step in assembling the microsensor cluster 10. The surface of the substrate 14 that faces oppositely from the surface on which the microactuator 12, mounting pads 114 and connection pads 68 are located is positioned to overlie the interconnect board 42. The substrate 14 is adhesively bonded to the interconnect board 42. Wires 136 are then electrically connected to connection pads 62, 64, 66, 68 and 44 to provide electrical connection from the connection pads 44 to the microactuators 12 and the microelectrodes 28.

Figure 14:
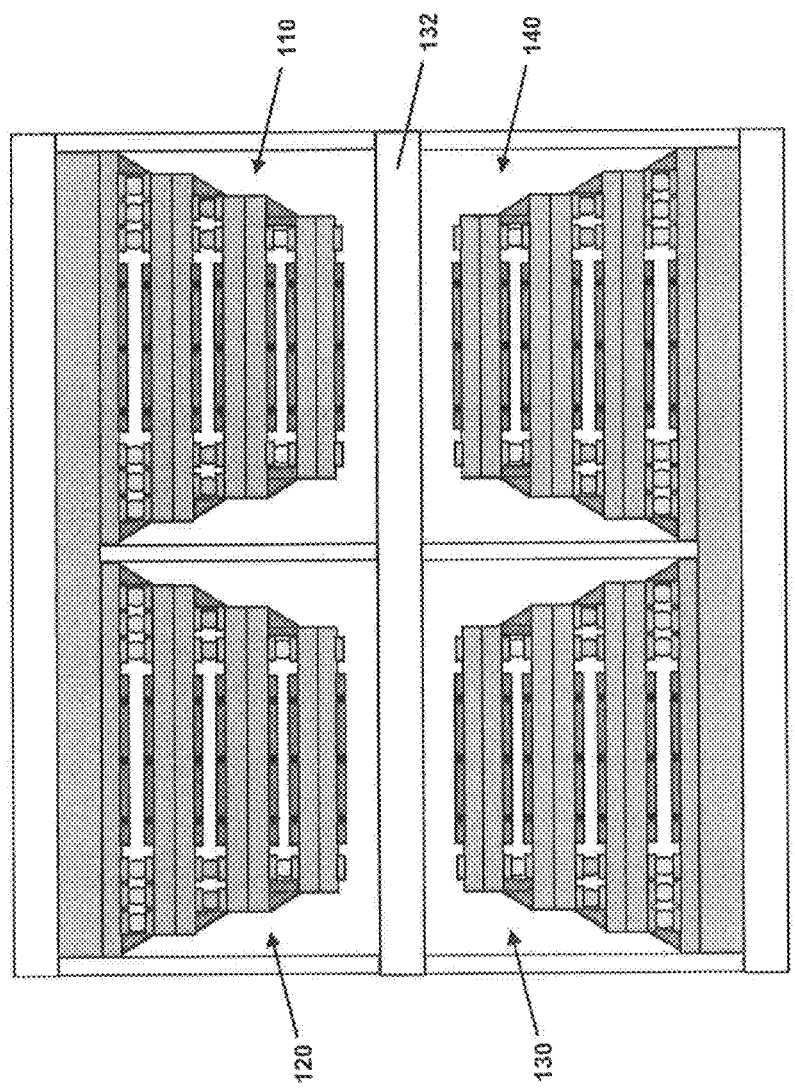
FIG. 14 illustrates an end view of a case in which four microsensor clusters are supported in accordance with an exemplary embodiment.
Figure 15:
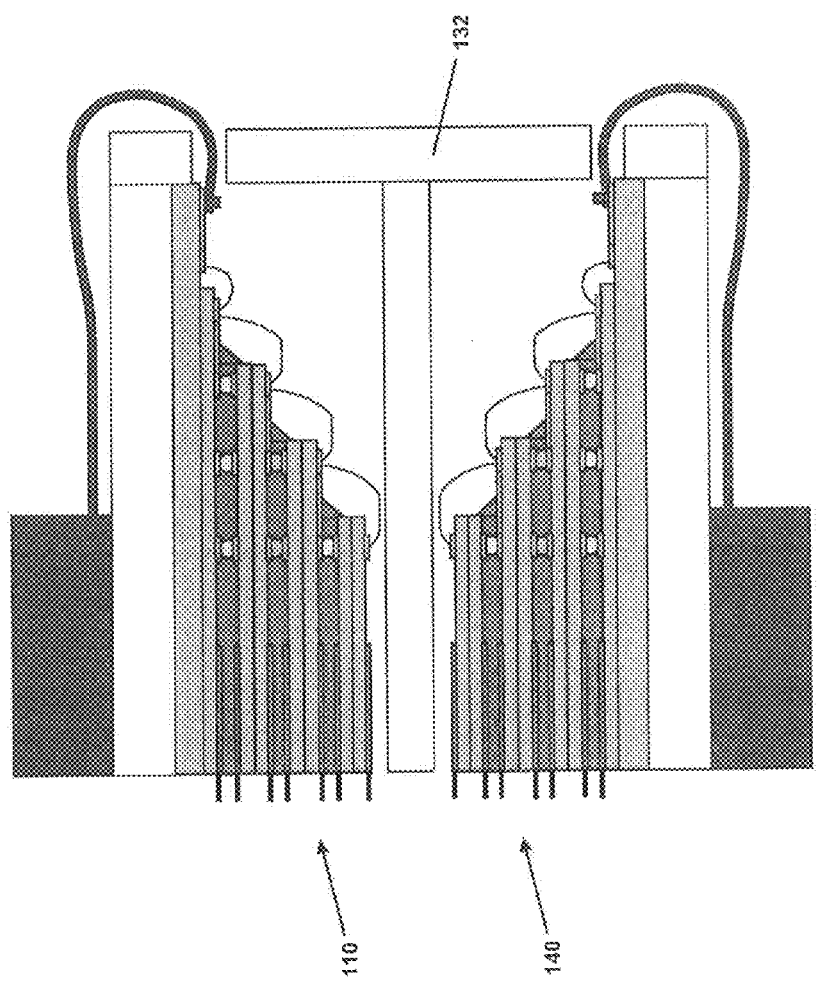
FIG. 15 illustrates a cutaway side view of a case and microsensor clusters in accordance with an exemplary embodiment.

FIGS. 14 and 15 illustrate a case 132 supporting four microsensor clusters, 110, 120, 130 and 140 made in accordance with principles of the present disclosure. As shown, microsensor clusters may be mounted adjacent to each other to provide sensors to monitor larger regions than can be monitored by a single cluster.

Figure 16:
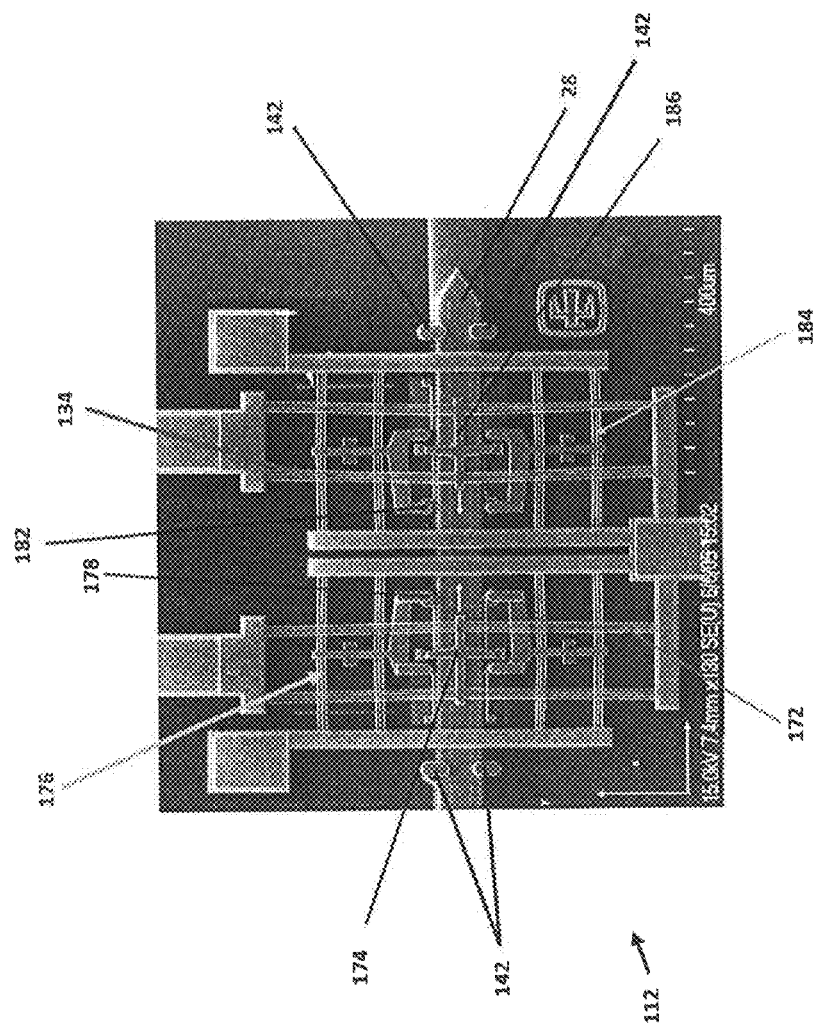
FIG. 16 illustrates a micrograph of a microactuator that can be used in a microsensor cluster in accordance with an exemplary embodiment.

FIG. 16 illustrates a micrograph of a 3 mm by 7 mm embodiment of an exemplary microactuator 12. The micrograph of FIG. 16 shows a mechanism 112 that includes an electrode 28 that is extended and retracted from the mechanism 112. The microactuator and microelectrodes are fabricated in Sandia National Laboratories using the SUMMiT-V process, which is a 5 layer highly doped polysilicon surface micromachining process that is described by J Muthuswamy, M Okandan, A Gilletti, M Baker, and T Jain, "An array of microactuated microelectrodes for monitoring single neuronal activity in rodents," IEEE Trans Biomed Eng, 52:1470-4477, 2005. The microactuators have 4 thermal actuators and allow for bi-directional movement with <10 μM resolution. FIG. 16 illustrates a SEM of a mechanism 112. The electrode 28 is 50 μm wide and 4 μm thick and can move a maximum distance of 5 mm in steps of about 8.8 μM. The mechanism 112 has a first powl 174 and a second powl 186. A move-up thermal actuator 172 causes powl 174 to translate by +X, 10 μm; when the current is off, powl 174 elastically moves back into its original position while translates the electrode by −X, 10 μm through teeth engagement mechanism. A move-down thermal actuator unlocking mechanism 176 causes ratchet 178, which normally stops the +X translation of microelectrode 28, to move in Y-direction in order to unlock the microelectrode 28. A move-up unlocking mechanism thermal actuator 184 causes ratchet 182, which normally stop the −X translation of the electrode 28, to move in Y-direction in order to unlock the electrode 28. A move down thermal actuator 134 causes powl 186 to translate by −X, 10 μm; when the current is off, the arrow elastically moves back into its original position while translates the electrode by −X, 10 μm through teeth engagement mechanism. Translation guides 142 align and guide the microelectrode 28.

Figure 17:
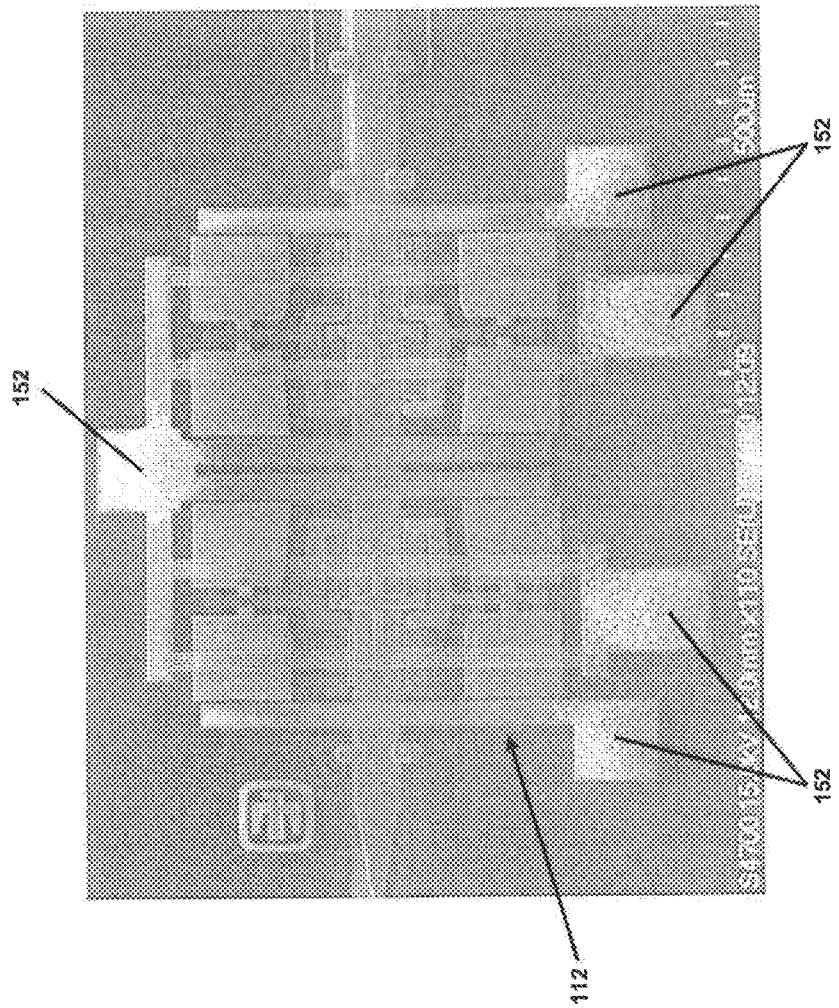
FIG. 17 illustrates a microactuator with solder bumps applied in accordance with an exemplary embodiment.
Figure 18:
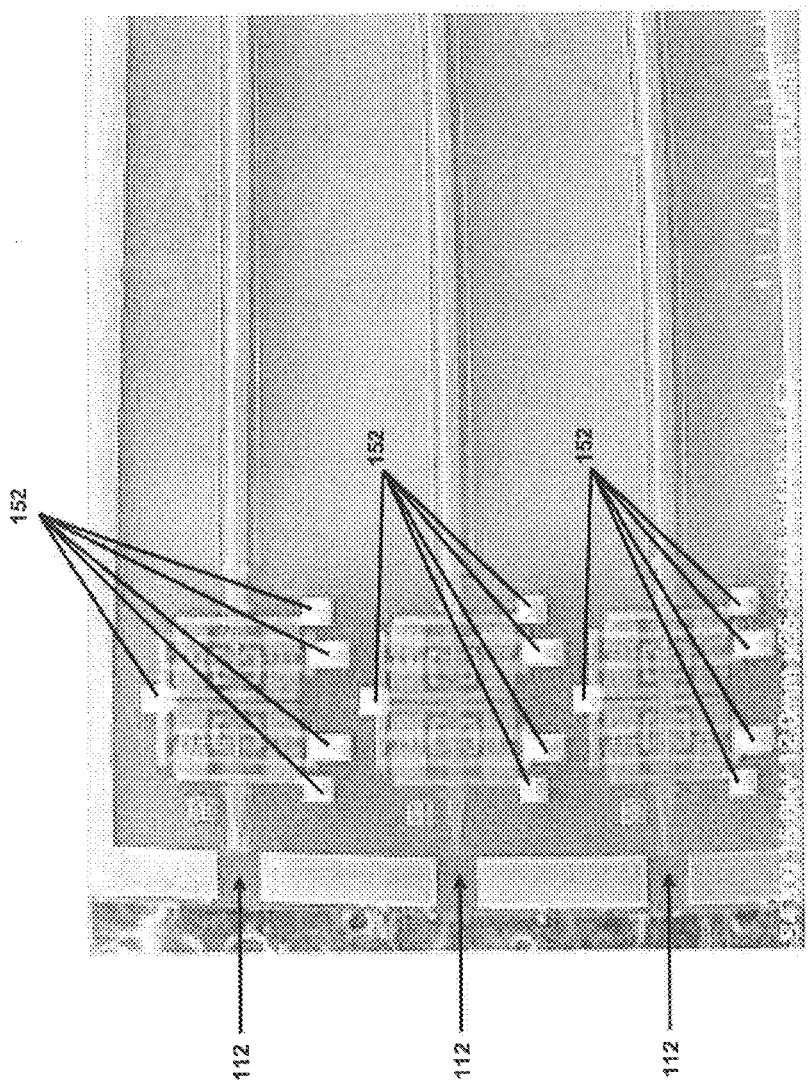
FIG. 18 illustrates three actuators arranged in a duster in accordance with an exemplary embodiment.

Packaging and interconnects contribute significant additional weight to the microactuators 12. In an exemplary embodiment, the chip itself weighs about 0.18 g and packaging can add about ten times this weight. In an effort to miniaturize implantable devices, MEMS technology is used to provide a packaging that is compact and light-weight. Utilizing flip-chip techniques provides an excellent solution enabling a compact form factor. There exist special challenges to adapt this technique for MEMS devices: (a) Headspace for movement due to the presence of actuators and/or moveable electrodes; (b) selection of a contamination free process in order to minimize and/or prevent obstruction of the moving MEMS parts; (c) utilizing a semi-hermetic seal that allows for the movement of the microelectrodes outside the die as well as keeping biological fluids, for example blood, cerebrospinal fluids, and the like from entering the chip. In an exemplary embodiment, bumps of Ag epoxy having a diameter of about 50 μm diameter that avoid flux contamination are used. FIG. 17 illustrates a SEM image of a mechanism 112 having Ag epoxy bumps 152. FIG. 18 illustrates a microactuator 12 after the bump forming process is complete on the entire chip.

Figure 19:
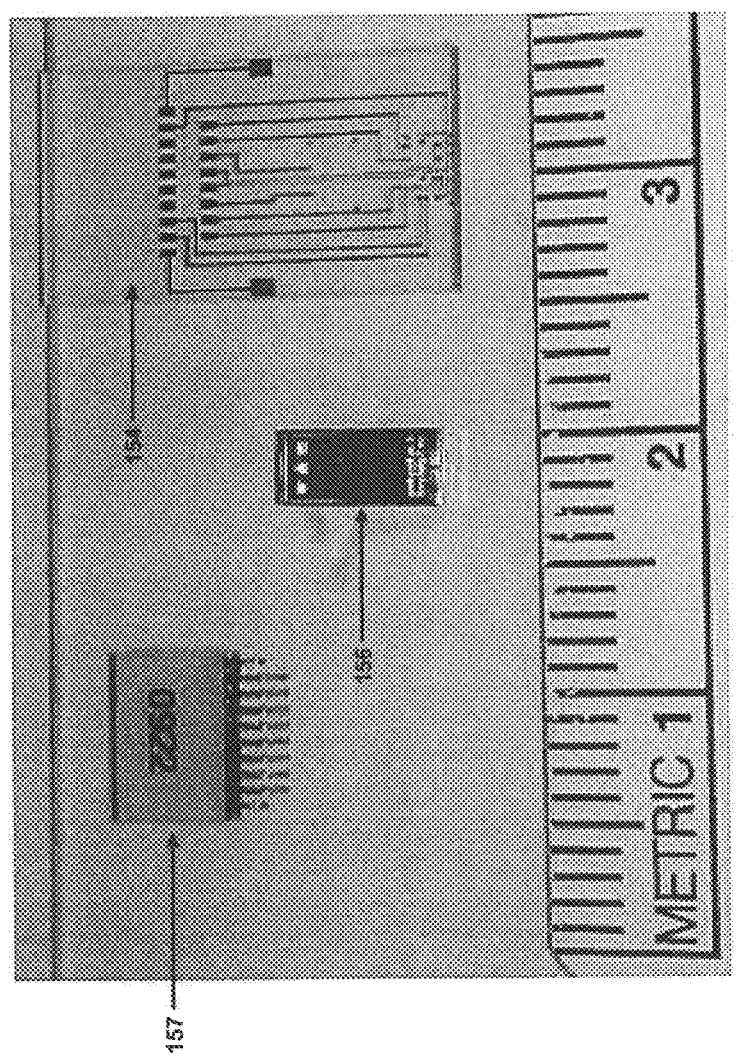
FIG. 19 illustrates components of a microactuator that may be incorporated into a microsensor cluster in accordance with an exemplary embodiment.
Figure 20:
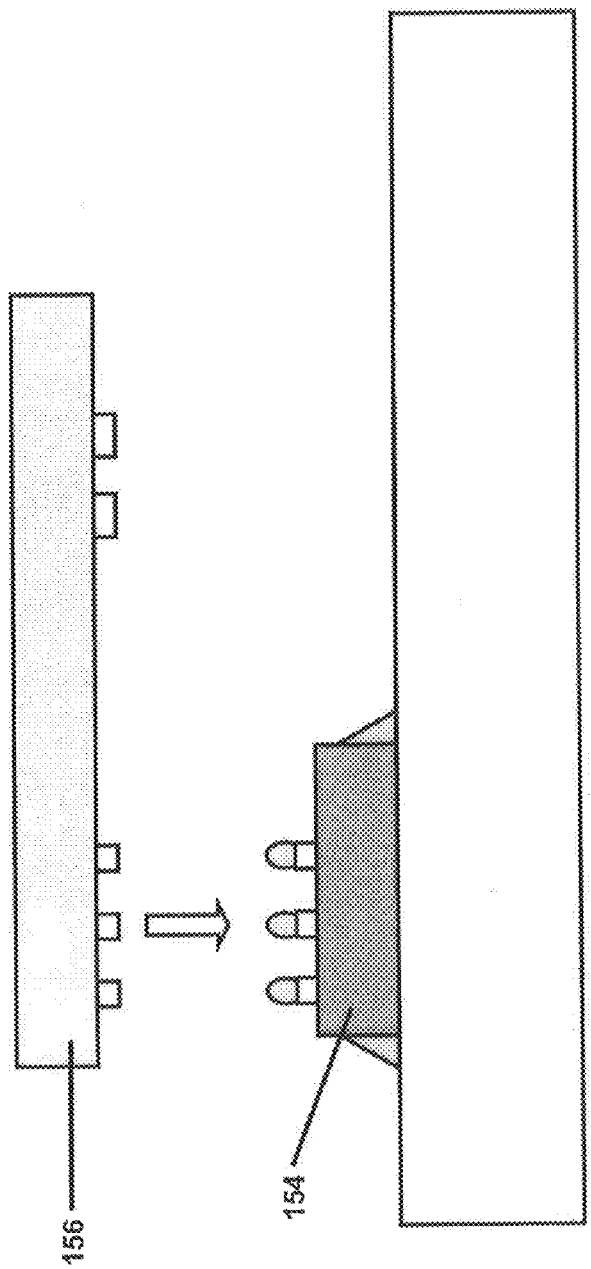
FIG. 20 illustrates connection of a MEMS component to a substrate in accordance with an exemplary embodiment.
Figure 21:
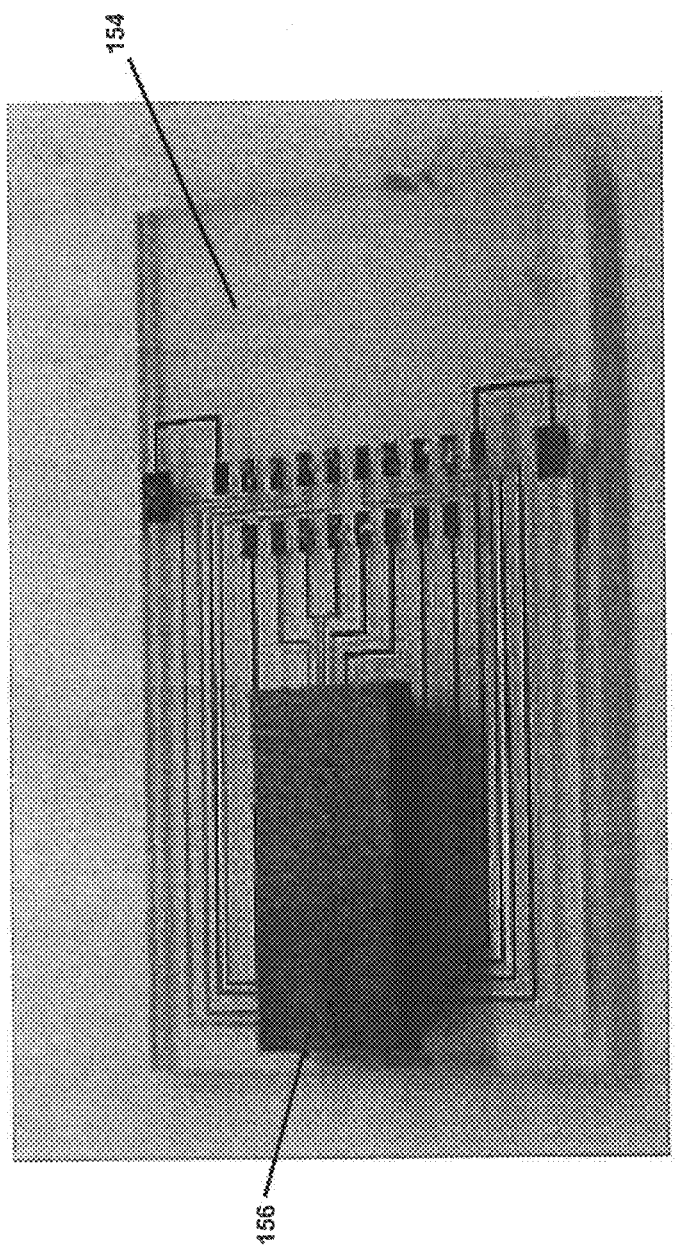
FIG. 21 illustrates a MEMS component mounted to a substrate in accordance with an exemplary embodiment.
Figure 22:
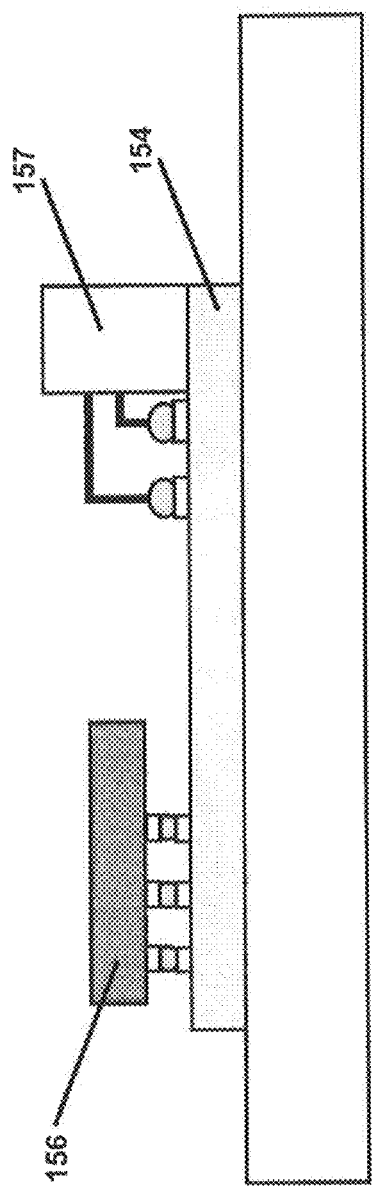
FIG. 22 illustrates a side view of a MEMS component and a connector both mounted to a substrate in accordance with an exemplary embodiment.
Figure 23:
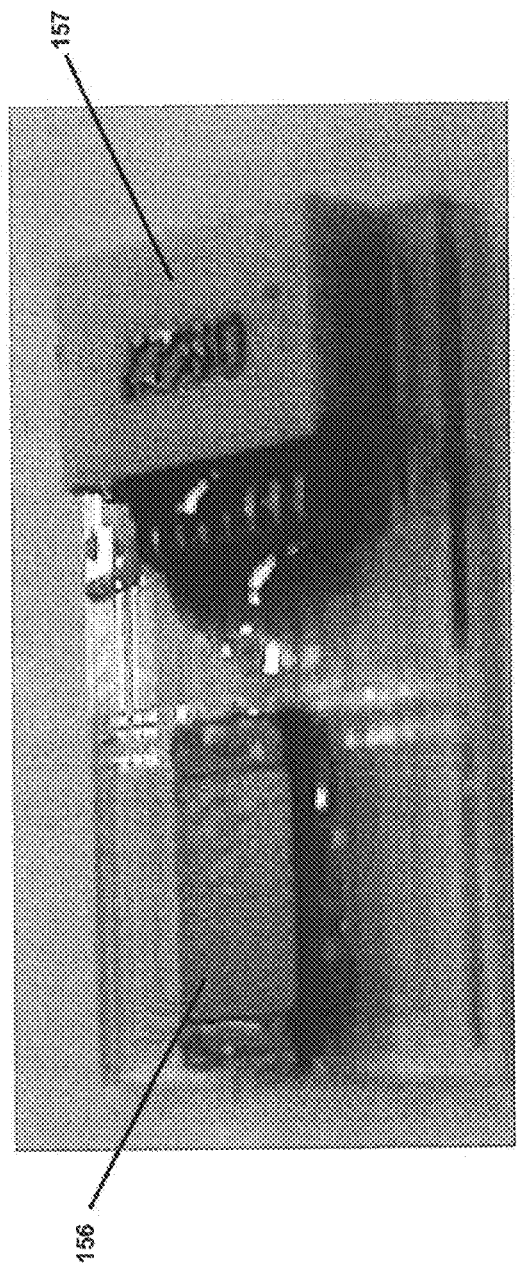
FIG. 23 illustrates a photograph of a MEMS component and a connector both mounted to a substrate in accordance with an exemplary embodiment.
Figure 24:
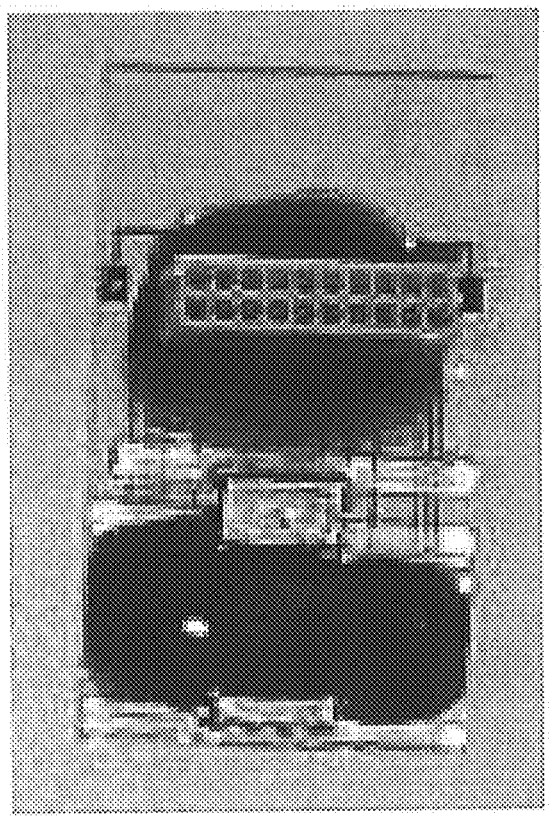
FIG. 24 illustrates a photograph of an assembly shown by FIG. 23 with a protective sealant coating in accordance with an exemplary embodiment.

In accordance with various exemplary embodiments, assembly of an exemplary microactuator 12 is illustrated by FIGS. 19 through 24. FIG. 19 illustrates the kitting step. A glass substrate 154 is fabricated with the corresponding bond pads as the MEMS chip and interconnects. Au is deposited through thermal evaporation (200 μm) and patterned to form the flip-chip substrate. MEMS chip 156 with Ag epoxy bumps and TLI (Third Level Interconnect) 157 are assembled. Ag epoxy bumps are deposited on the MEMS chip 156 as illustrated by FIG. 17. Flip-chip connecting joins the 500 μm glass substrate 154 to the MEMS chip 156 as shown by FIGS. 20 and 21. TLI 157 is joined to the glass substrate 154 using Ag epoxy as illustrated by FIG. 22. As illustrated by FIG. 23, the assembly is sealed by a semi-hermetic and hermetic seal—for example, a semi-hermetic seal on one edge and a hermetic seal on the other three sides using non-flow silicone. A hard protection is provided by applying epoxy sealant to protect the package as illustrated by FIG. 24.

Figure 25:
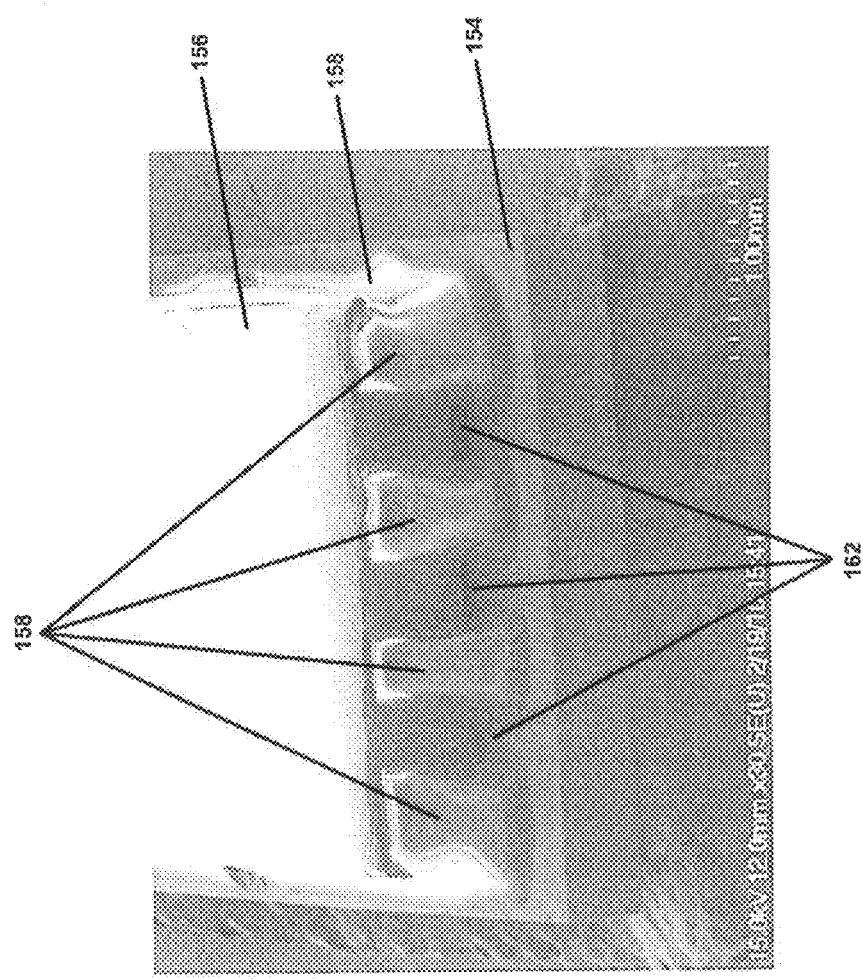
FIG. 25 illustrates an SEM image of a MEMS chip mounted to a substrate with a seal material in accordance with an exemplary embodiment.
Figure 26:
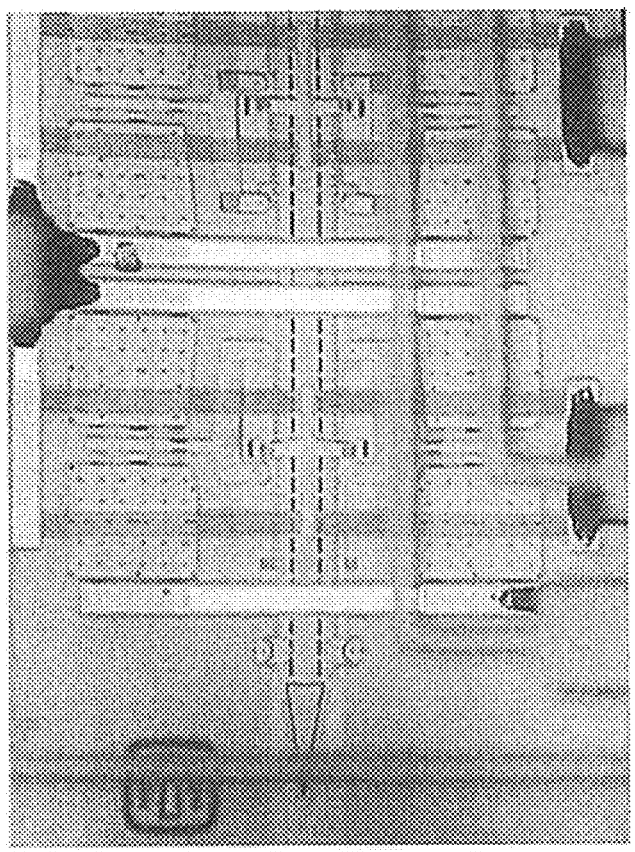
FIG. 26 illustrates a micrograph that shows a microactuator after assembly in accordance with an exemplary embodiment.

FIG. 25 illustrates MEMS chip 156 mounted to a glass substrate 154 with the semi-hermetic and hermetic non-flow silicone seal 158. The semi-hermetic seal is adjacent to three channels 162 within which the microelectrodes 28 move freely. FIG. 26 illustrates a micrograph that shows no flux contamination on the active MEMS structures after the flip chip process. In an exemplary embodiment, the flip-chip technique creates an assembly that is about 7 mm by about 9 mm and weighs approximately 0.5 g.

Figure 27:
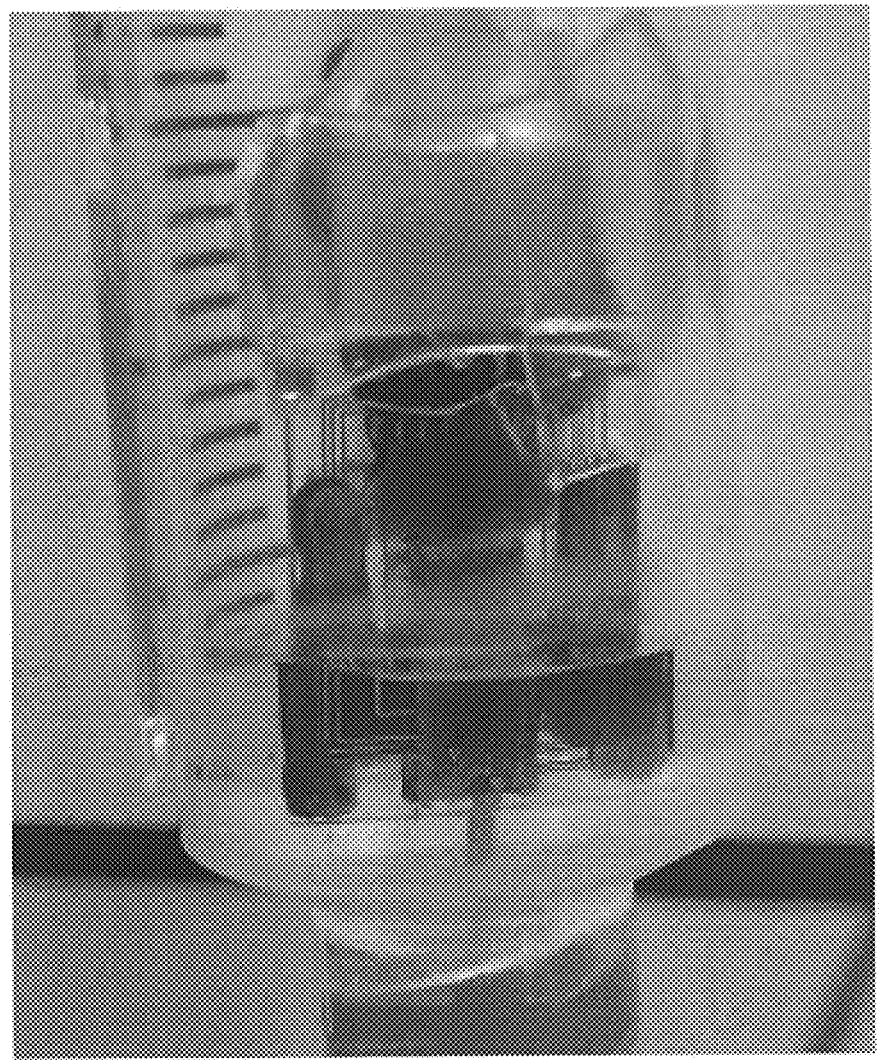
FIG. 27 illustrates a photograph that shows a leak test of a microactuator that is sealed for use as a neural sensor in accordance with an exemplary embodiment.

FIG. 27 illustrates a static pressure test of the assembly. The assembly was immersed in saline after the semi-hermetic seal was applied. The seal was shown to block fluid entrance at the maximum pressure of 80 cm of water, or about 7.8 kPa. At the pressure of 80 cm of water, traces of fluid start to leak into the channel.

Figure 28:
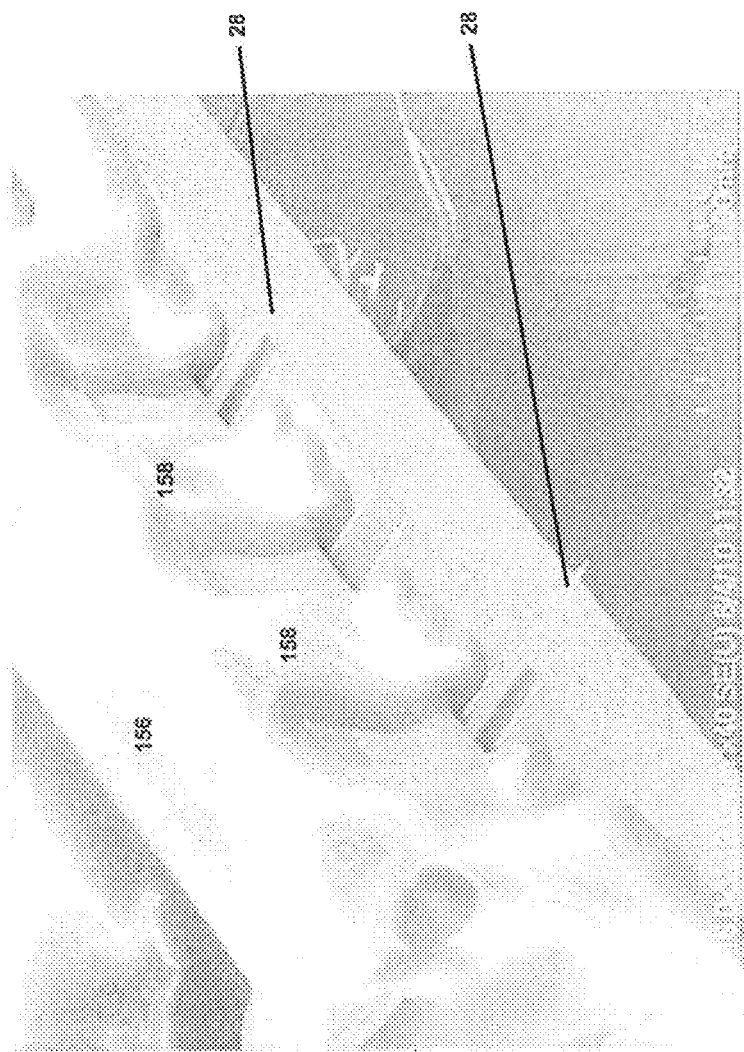
FIG. 28 illustrates an SEM image of a microactuator with sealant for use as a neural sensor in accordance with an exemplary embodiment.
Figure 29:
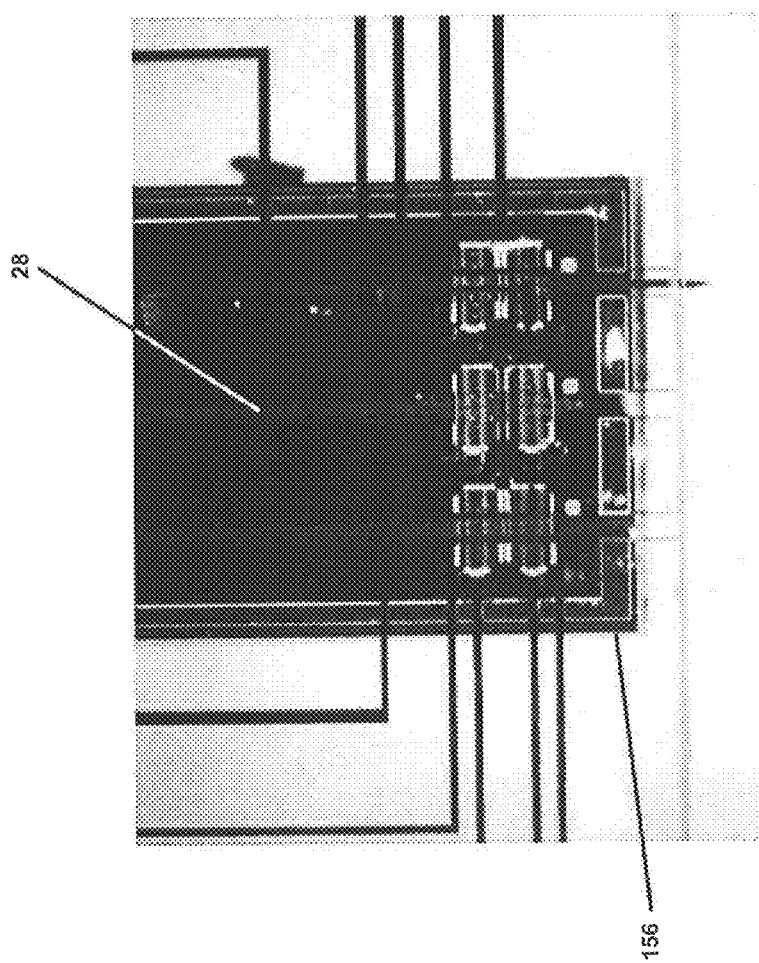
FIG. 29 illustrates a micrograph of a microactuator having a retracted microelectrode in accordance with an exemplary embodiment.
Figure 30:
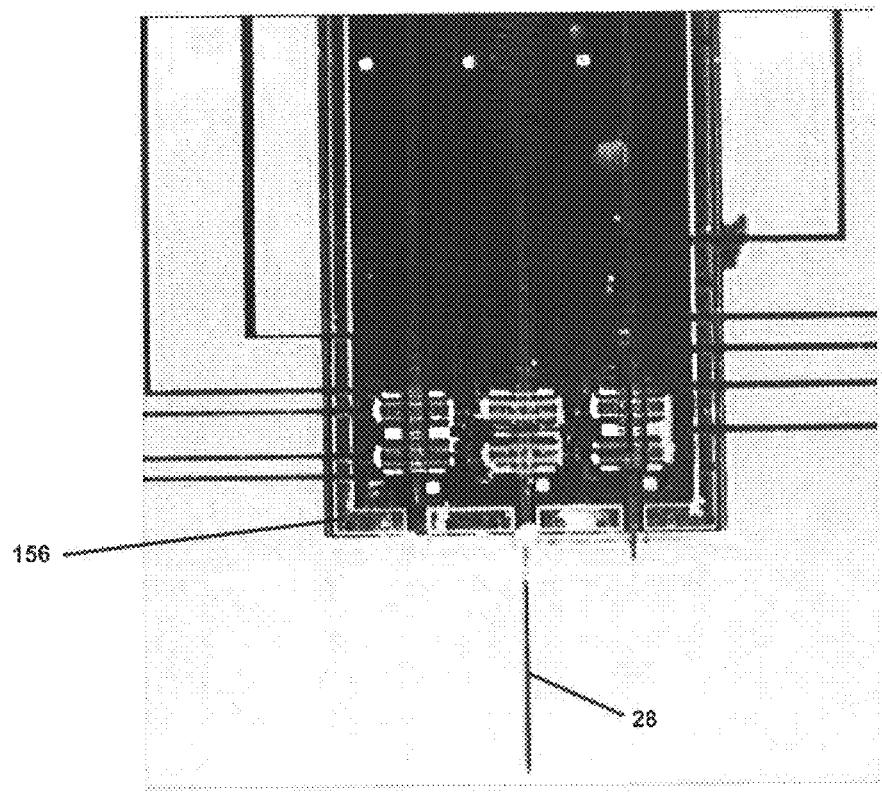
FIG. 30 illustrates a micrograph of a microactuator having an extended microelectrode in accordance with an exemplary embodiment.

FIGS. 28-30 illustrate movement of microelectrodes 28 from the MEMS chip 156. FIG. 28 illustrates a SEM image of right and left microelectrodes 28 extending from the channels in the semi-hermetic seal 158. FIG. 29 illustrates a micrograph showing the middle electrode 28 of MEMS chip 156 before actuation. FIG. 30 illustrates a micrograph showing the middle electrode 28 extended after actuation. Note that the spring that tethers the electrode to the bond-pad for electrical recording is also extended.

Figure 31:
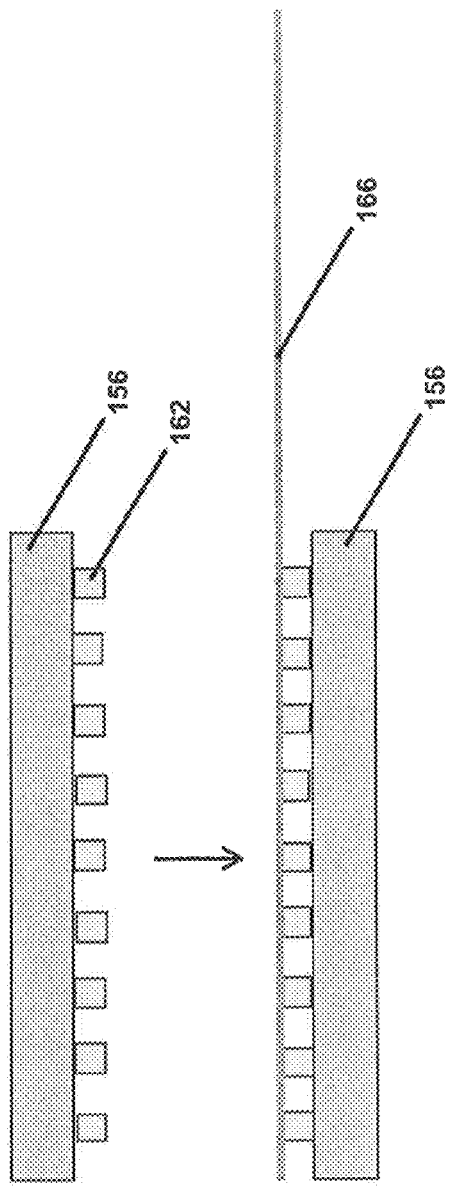
FIG. 31 illustrates a side view of assembly of a MEMS chip with a flexible interconnect in accordance with an exemplary embodiment.
Figure 32:
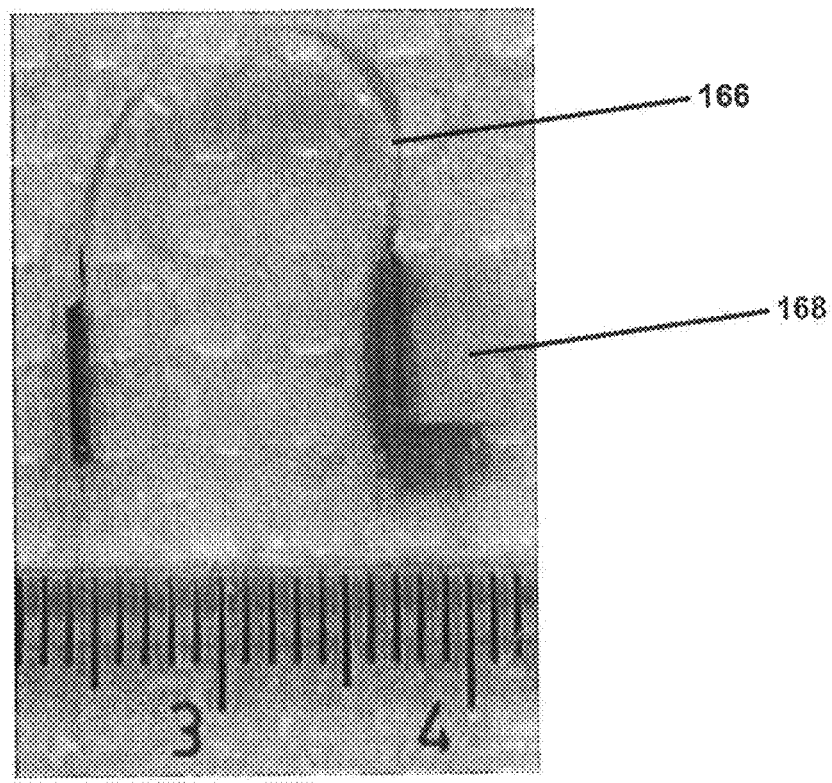
FIG. 32 illustrates a side view of a MEMS chip connected to a connector by a flexible interconnect in accordance with an exemplary embodiment.

The force exerted on neural implants during insertion and removal of interconnects can be significant, and can eventually can lead to implant failure. In order to isolate these forces from the MEMS chip, a flexible parylene interconnect may be utilized. These flexible interconnects makes the form factor of the package even smaller comparable to the actual chip itself. Flip chip techniques described herein can be adapted to bond the MEMS chip to parylene flexible substrate. FIG. 31 illustrates a MEMS chip 156 with Ag epoxy bumps 162, and a parylene substrate 166 is connected by flip-chip connection to the Ag epoxy bumps on the MEMS chip 156. FIG. 32 illustrates a complete packaged MEMS chip with flexible parylene interconnect 166 connecting the MEMS chip 156 to a connector 168.

Devices and methods in accordance with principles of the present disclosure are not limited to use with a particular instrument. Principles of the present disclosure can be adapted to a variety of clusters of MEMS components, for example MEMS sensors, MEMS gyroscopes, MEMS accelerometers, and/or the like.

Figure 33:
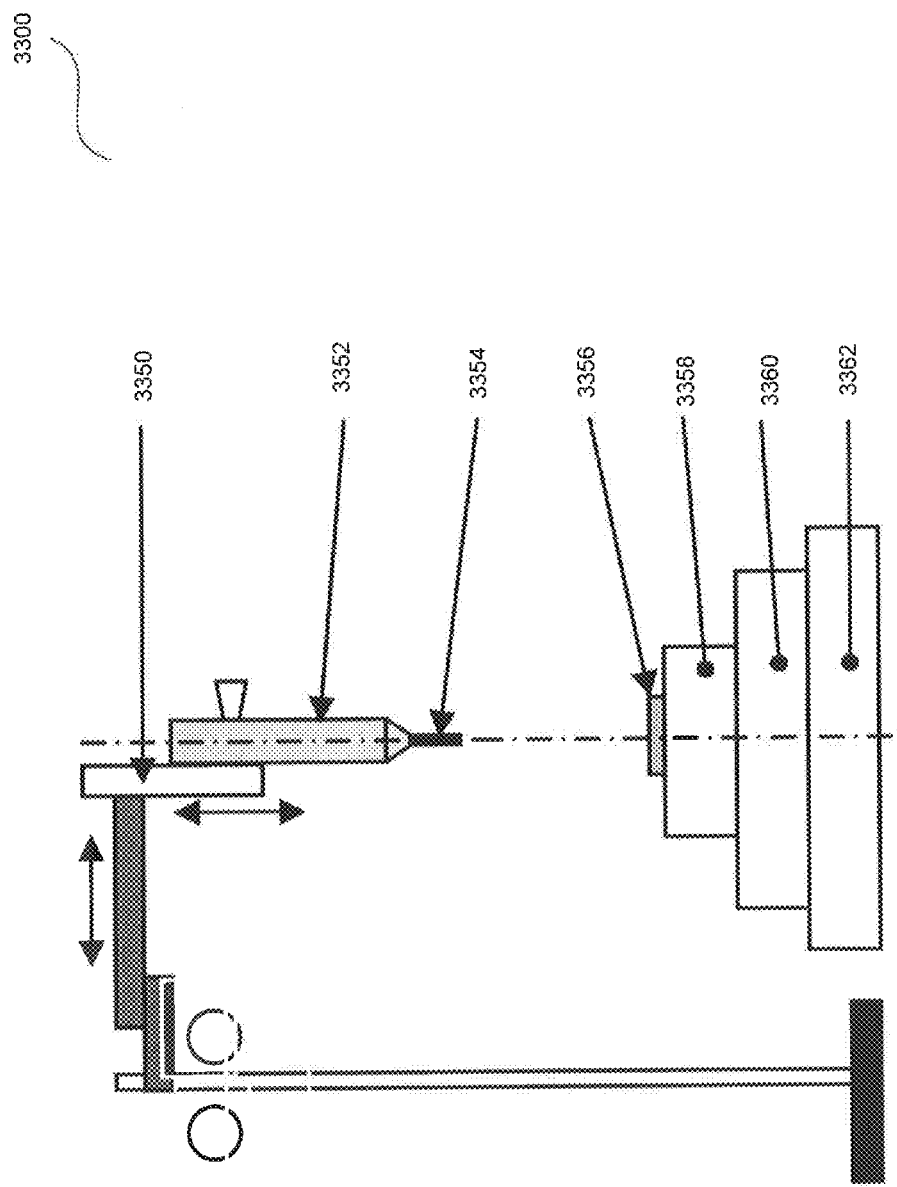
FIG. 33 illustrates a flip-chip interconnect apparatus in accordance with an exemplary embodiment.

Turning now to FIG. 33, in accordance with various exemplary embodiments MEMS and other microelectronic components may be utilized in connection with a flip-chip interconnect and/or reflow processes and related devices. Flip-chip interconnects configured in accordance with principles of the present disclosure can provide high aspect ratio interconnects, for example interconnects having an aspect ratio as high as 4. Moreover, interconnect and/or reflow methods of the present disclosure can achieve wider interconnect height tolerances among interconnects (for example, interconnects having a height variability of up to about 30%) while still achieving reliable electrical connections. Moreover, flip-chip interconnects configured in accordance with principles of the present disclosure can provide improved z-axis spacing between die-to-die and/or die-to-substrate flip chip stacks, for example z-axis spacing as large as 600 μm. In this manner, additional spacing can be achieved for MEMS devices and/or similar components that are extendable and/or deformable out of the die plane.

Continuing to reference FIG. 33, interconnects configured in accordance with principles of the present disclosure may be created via use of a suitable apparatus, for example interconnect fabrication station 3300. In an exemplary embodiment, interconnect fabrication station 3300 comprises a 5 degree of freedom manipulator 3350 coupled to a syringe 3352 having a needle 3354. Manipulator 3350 is configured to move syringe 3352 in the X, Y, and Z directions. Needle 3354 may be sized as desired. In an exemplary embodiment, needle 3354 comprises a 32 gauge needle with an outer diameter of about 240 μm. In various exemplary embodiments, needle 3354 is configured with an outer diameter of between about 100 μm and about 1,000 μm.

In various exemplary embodiments, syringe 3352 and needle 3354 may be replaced with a dispenser 3352 having a dispensing tip 3354. For example, a pneumatic dispenser such as the Ultimus I electronic fluid dispenser from Nordson Inc. of Westlake, Ohio may be utilized. Dispenser 3352 may be configured with a dispensing tip 3354 having a desired size, for example dispensing tip 3354 having an inner diameter of about 100 μm. In various exemplary embodiments, dispensing tip 3354 is configured with an inner diameter of between about 100 μm and about 1,000 μm.

In an exemplary embodiment, interconnect fabrication station 3300 further comprises a rotational stage 3358 upon which a die or substrate 3356 may be mounted. In an exemplary embodiment, rotational stage 3358 is a Newport model M-RS65; however, any suitable rotational stage may be used. Rotational stage 3358 is coupled to Z-axis translational stage 3360. In an exemplary embodiment, Z-axis translational stage 3360 is a Newport model M-MVN80; however, any suitable Z-axis translational stage may be used. Z-axis translational stage 3360 is coupled to X-Y translational stage 3362. In an exemplary embodiment, X-Y translational stage 3362 is a Newport model M-401; however, any suitable X-Y translational stage may be used.

In contrast to prior apparatus for flip-chip processing which typically require separate equipment for each packaging step, interconnect fabrication station 3300 may be configured to dispense solder and/or paste, perform reflow, flip-chip and finally underfill for hermetic/semi-hermetic sealing. Interconnect fabrication station 3300 may be utilized to create novel first level interconnects; additionally, interconnect fabrication station 3300 may be utilized to create 3D stacks of MEMS chips.

Figure 34A:
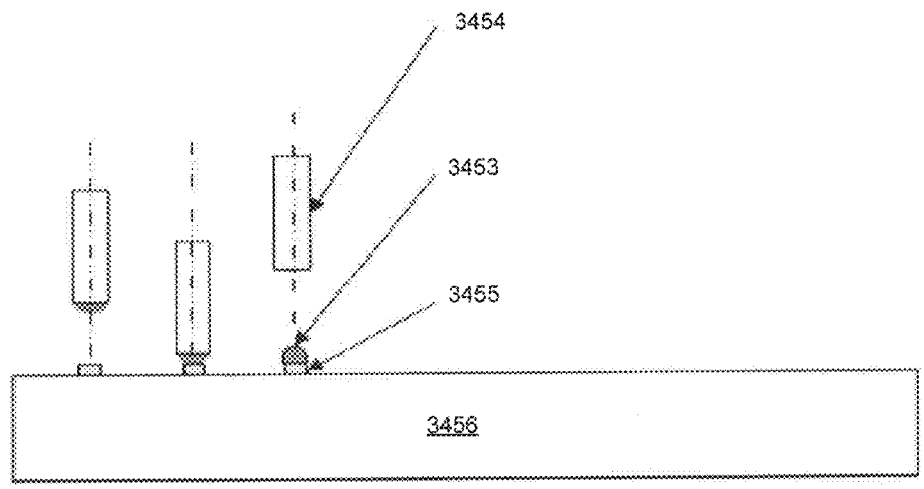
FIG. 34A illustrates a "dip and attach" technique for flip-chip interconnect in accordance with an exemplary embodiment.
Figure 34B:
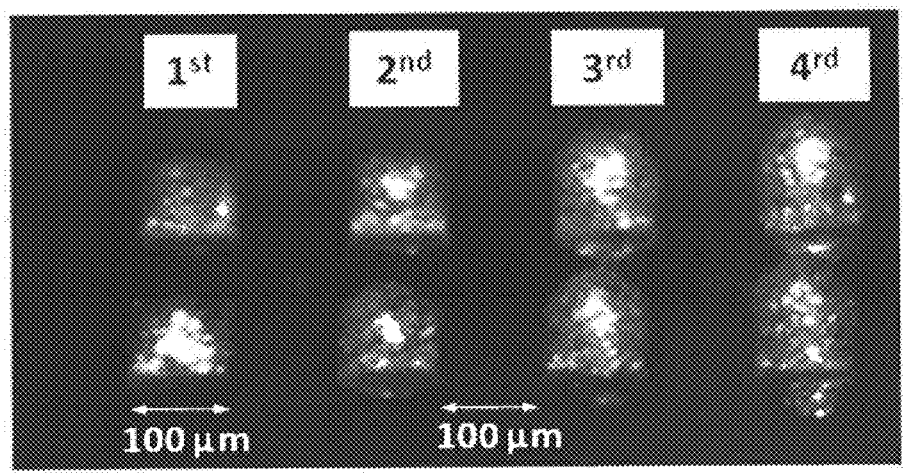
FIG. 34B illustrates exemplary flip-chip interconnects formed using a "dip and attach" technique in accordance with an exemplary embodiment.
Figure 34C:
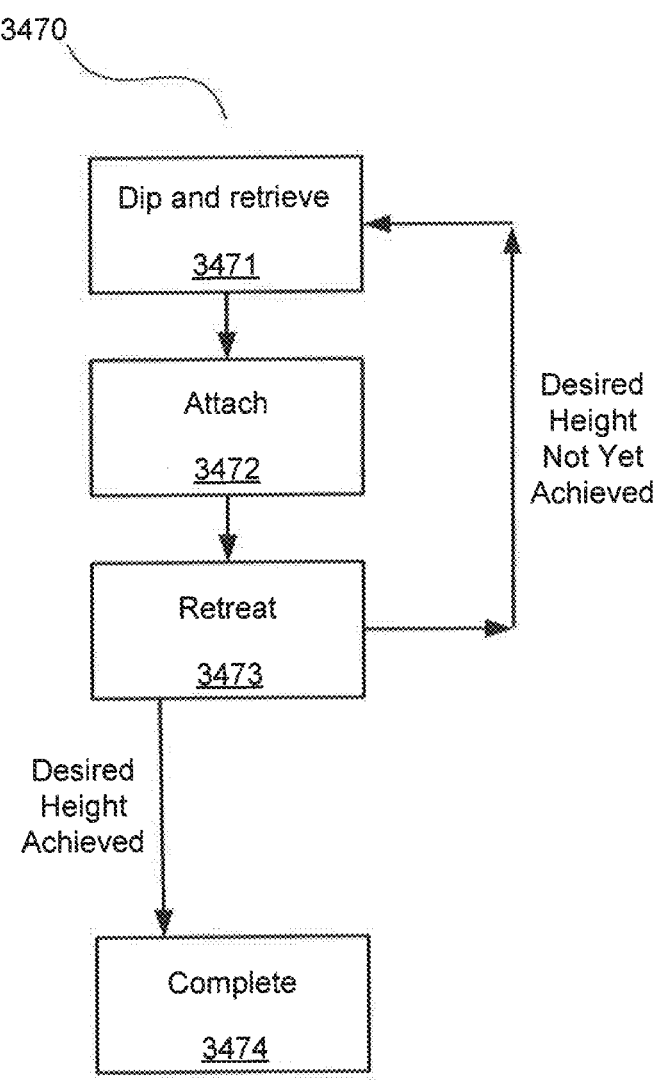
FIG. 34C illustrates a block diagram of a "dip and attach" technique in accordance with an exemplary embodiment.

Turning now to FIGS. 34A through 34C, in various exemplary embodiments interconnect fabrication station 3300 may be used to fabricate interconnects using a "dip and attach" technique 3470. In dip and attach technique 3470, a commercially available silver (Ag) epoxy (for example E3001, manufactured by Epoxy Technology Inc., of Billerica, Mass.) may be used. Epoxies of copper, gold, and/or the like may also be utilized, as suitable. In an exemplary embodiment, a selected Ag epoxy contains Ag particulates of about 1 μm to about 5 μm in diameter. Ag epoxy may desirably be utilized in a wide variety of applications, for example in connection with bond pad surfaces suitable for use with glass, plastic, and/or other substrates (e.g., as used in MEMS and bioMEMS) where solder does not adhere well. In various exemplary embodiments, a bond pad 3455 for receiving the interconnect material is about 100 μm×100 μm in size; however, bond pad 3455 sizes of about 50 μm to about 500 μm may be utilized.

With specific reference to FIGS. 34A and 34C, in an exemplary embodiment dip and attach technique 3470 comprises dipping needle 3354 into a bath of Ag epoxy until the tip of needle 3354 is fully covered by Ag epoxy, and retrieving needle 3354 from the epoxy bath with a small amount of Ag epoxy on the tip (step 3471). Needle 3354 is then moved close to the pad (for example, within about 25 μm of the pad) until the Ag epoxy fully touches and covers the bond pad 3455 (step 3472). Needle 3354 is then retrieved with a small amount of Ag epoxy residue on the tip (step 3473). Most of the Ag epoxy is left attached to the bond pad 3455, forming a bump 3453. Repeating steps 3471 through 3473 allows for creation of an interconnect of increasing height, for example as illustrated in FIG. 34B. When the interconnect reaches a desired height, the process is complete (step 3474).

For Ag bump interconnects, taller bumps may be achieved by simply repeating the "dip and attach" steps. The trend is generally linear. In various exemplary embodiments, for a single application of dip and attach technique 3470, the bump height after reflow was approximately 80 μm. Bumps as tall as 120 μm can be produced after four repetitions of dip and attach technique 3470. The ability to create consistent bumps of different heights is advantageous, as different applications may require different bump heights. For example, CPUs typically require a bump height of about 50 μm, while MEMS applications may require bump heights of about 100 μm. A shorter bump height can be achieved by having smaller bond pad 3455 size, for example a bond pad size of about 50 µm by 50 µm. With these bond pad sizes, bumps as short as 30 µm can be achieved with a single application of dip and attach technique 3470. As will be appreciated, smaller bond pads will provide more space for higher density interconnects.

Figure 35A:
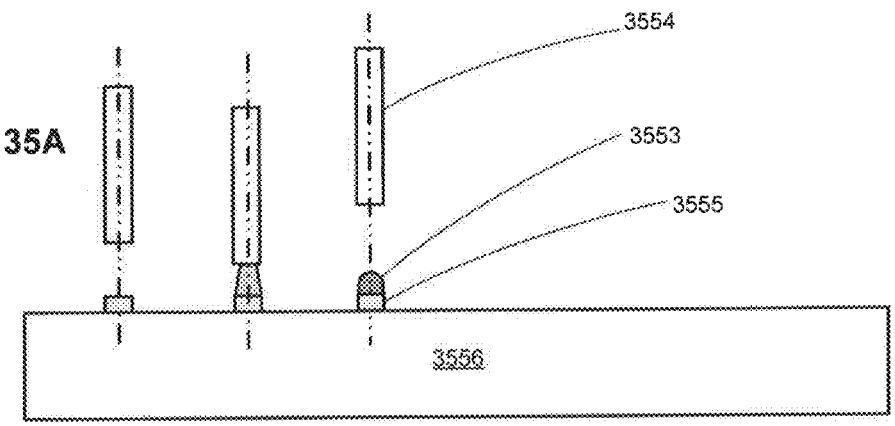
FIG. 35A illustrates a "dispense" technique for flip-chip interconnect in accordance with an exemplary embodiment.
Figure 35B:
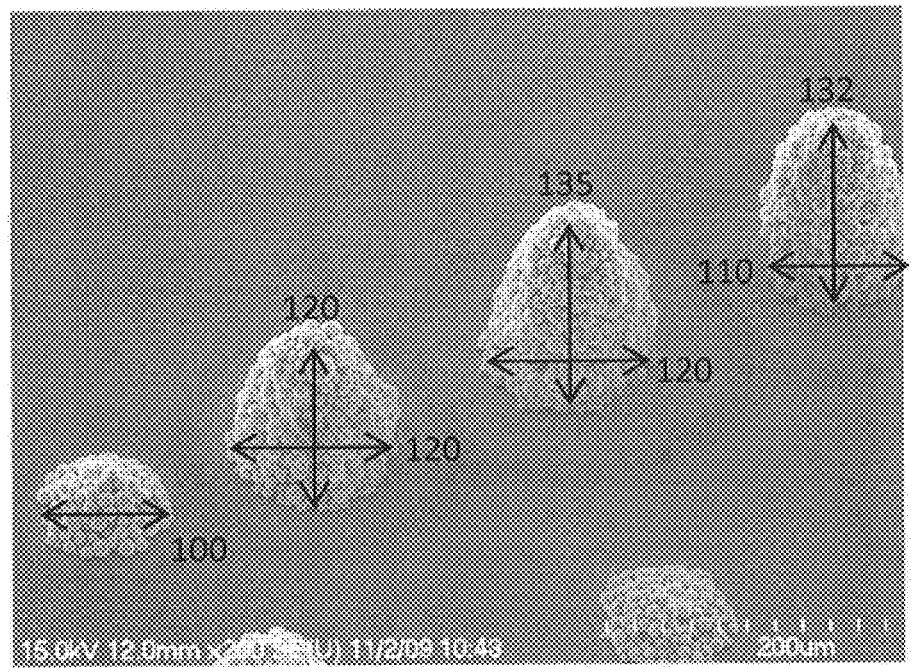
FIG. 35B illustrates exemplary flip-chip interconnects formed using a "dispense" technique in accordance with an exemplary embodiment.
Figure 35C:
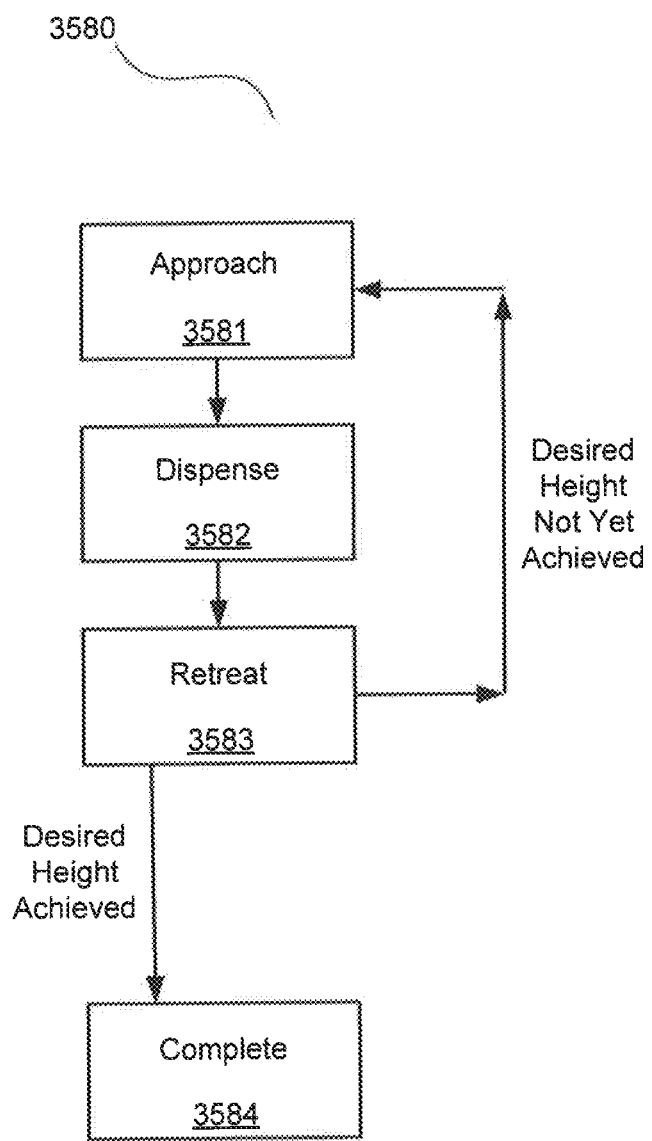
FIG. 35C illustrates a block diagram of a "dispense" technique in accordance with an exemplary embodiment.

Turning now to FIGS. 35A through 35C, in various exemplary embodiments interconnect fabrication station 3300 may be used to fabricate interconnects using a "dispense" technique 3580. In dispense technique 3580, commercially available lead (Ph) based solder paste (for example, 63Sn, 37Pb, flux material NC-SMQ90 from Indium Inc.) may be used. Other similar lead solder paste, and/or lead-free solder paste (for example, SAC305) may also be utilized, as suitable. In various exemplary embodiments, a solder paste of mesh type 6 may be utilized, which contains solder particulates of about 5 µm to about 15 µm diameter.

With specific reference to FIGS. 35A and 35C, dispense technique 3580 comprises bringing the dispensing tip 3554 into a close proximity of about 25 µm to about 50 µm with the bond pad 3555 surface (step 3581). As will be appreciated, instead of a bond pad surface, the surface could also be a die surface with underline interconnects, and/or the like. Solder paste is then dispensed (step 3582). Generally, the distance between dispensing tip 3554 and the bond pad surface should not exceed about the inner diameter of dispensing tip 3554 at the time of dispensing. The size of the bond pad will influence the amount of solder paste to be dispensed. In an exemplary embodiment, for a pad size of 100 µm×100 µm square, the solder paste was dispensed with a pressure of about 60 psi and a pulse time of about 10 ms with two pulses/puffs. Other suitable pressure and pulse times may be utilized.

Dispensing tip 3554 is then pulled away from the bond pad (step 3583), (step 3583). Additional solder paste can be added by repeating steps 3581 through 3583 to create bumps of higher aspect ratio, for example as illustrated in FIG. 35B. When the interconnect reaches a desired height, the process is complete (step 3584). In various exemplary embodiments, utilizing multiple dispensing steps allows for creation of solder paste bumps 3553 with heights of 100 µm or more after reflow.

Figure 36A:
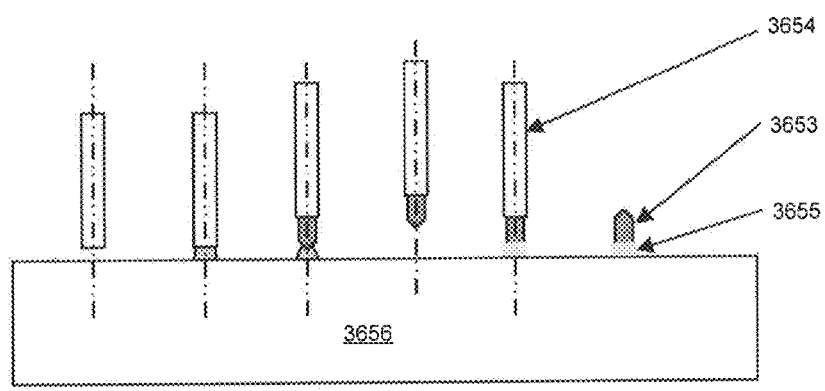
FIG. 36A illustrates a "dispense, pull, and attach" technique for flip-chip interconnect in accordance with an exemplary embodiment.
Figure 36B:
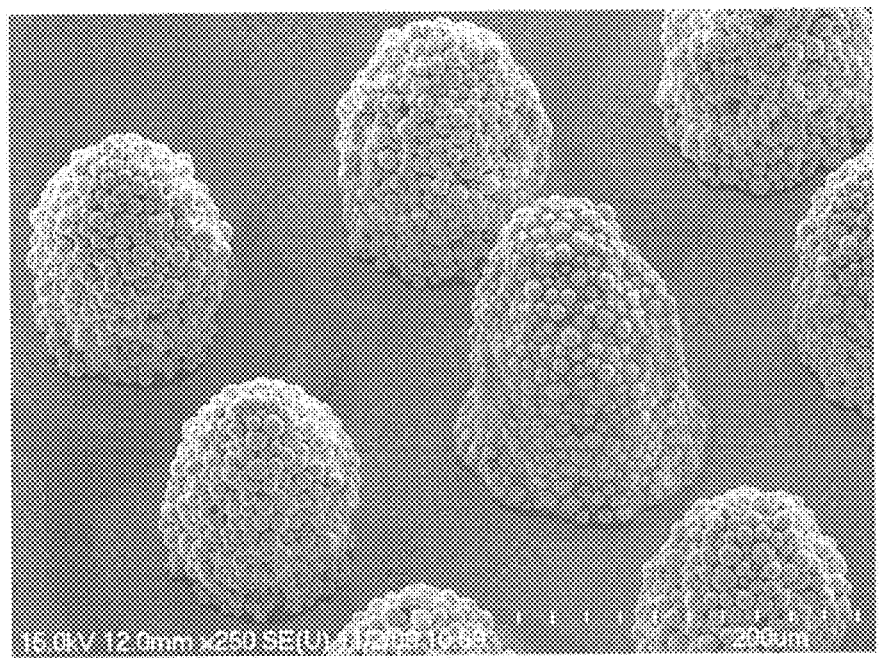
FIG. 36B illustrates exemplary flip-chip interconnects formed using a "dispense, pull, and attach" technique for flip-chip interconnect in accordance with an exemplary embodiment.
Figure 36C:
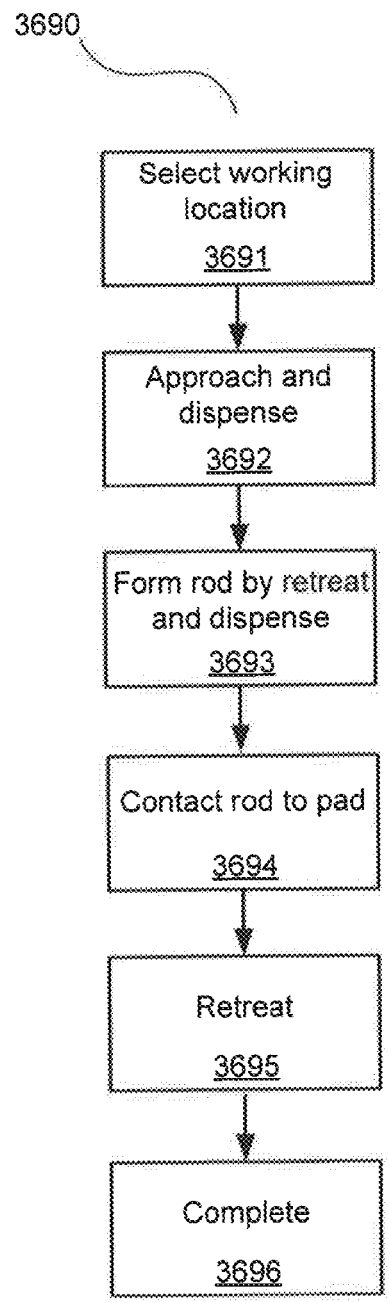
FIG. 36C illustrates a block diagram of a "dispense, pull, and attach" technique in accordance with an exemplary embodiment.

Turning now to FIGS. 36A through 36C, in various exemplary embodiments interconnect fabrication station 3300 may be used to fabricate interconnects using a "dispense, pull, and attach" technique 3690. In dispense, pull, and attach technique 3690, commercially available lead (Ph) based solder paste (for example, 63Sn, 37Pb, flux material NC-SMQ90 from Indium Inc.) may be used. Other similar lead solder paste may also be utilized, as suitable. For example, various lead-free solder pastes may be utilized. Moreover, stated generally, any suitable mixture of metal particulate and fluidic vehicle may be utilized. In various exemplary embodiments, a solder paste of mesh type 6 may be utilized, which contains solder particulates of about 5 µm to about 15 µm diameter.

With specific reference to FIG. 36C, in an exemplary embodiment, dispense, pull, and attach technique 3690 comprises selecting a surface where solder is not intended to be finally placed, for example an inactive, unusable and/or sacrificial portion of a die or substrate (step 3691). Dispensing tip 3654 is brought in close proximity to the surface (for example, approximately 25 µm) and the 1st pulse or puff is delivered to dispense the solder paste (step 3692). Dispensing tip 3654 is slowly retrieved upward while continuing to dispense the solder paste for the 2nd, 3rd, 4th puffs, etc until the solder paste starts to neck. In various exemplary embodiments, dispensing tip 3654 is retrieved upward at a rate of between about 25 µm per 10 milliseconds and about 25 µm per second. Moreover, in various exemplary embodiments, solder paste is dispensed via a pulse or puff of between about 25 psi and about 80 psi. Additionally, in various exemplary embodiments, solder paste is dispensed over a pulse or puff duration of between about 10 milliseconds and about 10 seconds. As dispensing tip 3654 is fully retrieved away from the surface (step 3693), a long rod shaped structure of solder paste is produced. This shape is produced by forces of surface tension and adhesion between the flux and the orifice of dispensing tip 3654.

The "rod" of solder paste is brought in contact with the surface of the bond pad 3655 (step 3694), and dispensing tip 3654 is retrieved slowly (step 3695), causing the rod to separate from dispensing tip 3654 and leaving the rod of solder paste on the bond pad as a tall "bump" 3653. At this point, the process is complete (step 3696). In various exemplary embodiments where the bond pad 3655 is about 100 µm square, bumps 3653 as tall as about 250 µm to about 300 µm can be produced prior to reflow.

Figure 37:
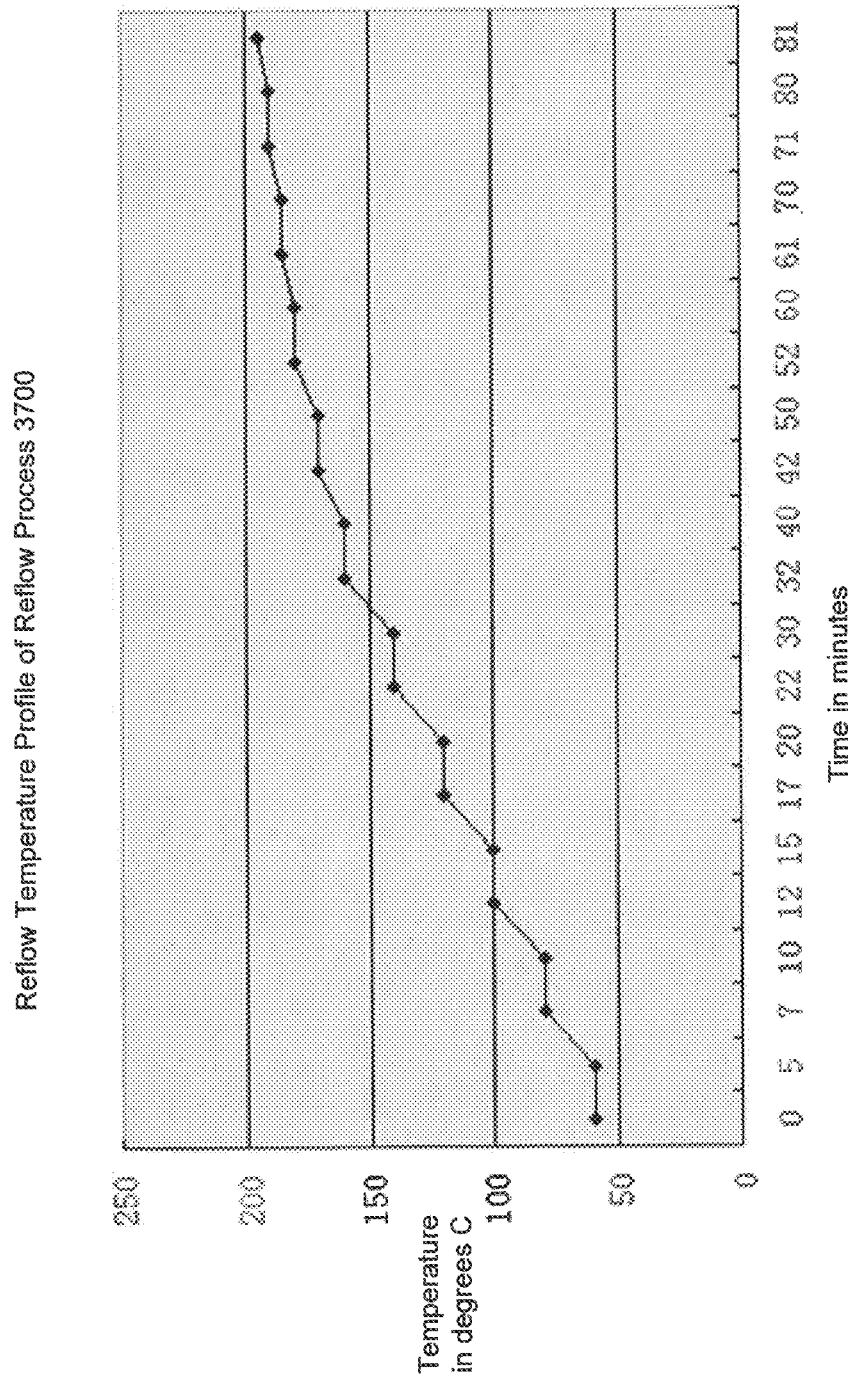
FIG. 37 illustrates a temperature profile for a reflow process for interconnects in accordance with an exemplary embodiment.

Turning now to FIG. 37, flip-chip bonding processes utilizing solder paste typically utilize a reflow process as is known in the art. During the reflow process, a number of things happen: flux and solder separate; solder particulates merge together, overcoming the surface tension that separates flux and solder particulates; solder particulates merge with one another and make surface contacts; and flux evaporates. Typically, the solder reflow process is a fast and volatile process, lasting for about 3-5 minutes, and rising to a temperature of 30° C. to 40° C., above the melting temperature of the solder. During this reflow process, the flux is still wet as it does not have sufficient time to fully evaporate. The flux reacts chemically with the solder particulates and forms a smooth spherical solder bump. Any excess flux is often left underneath the solder sphere as a yellow solidified residue. In the semiconductor industry, this excess flux is typically removed by a jet of warm water and soap solution. This flux removal process is non-ideal for microchips with moveable mechanical structures, as the moveable mechanical structures can be damaged or destroyed by the water jet. Additionally, a conventional fast reflow process will usually contaminate the area surrounding the bond pads in a MEMS chip with solidified flux, which can jam/freeze nearby active mechanical structures. For example, a conventional reflow process often requires a spacing of at least 500 µm between a bond pad and an active mechanical structure in order to avoid contamination and/or freezing of the mechanical structure.

In contrast, in accordance with principles of the present disclosure, a modified reflow process 3700 may desirably be utilized. For example, modified reflow process 3700 may suitably be utilized to reflow interconnects formed via dispense technique 3580 and/or dispense, pull, and attach technique 3690. Modified reflow process 3700 can reduce flux contamination; moreover, modified reflow process 3700 helps preserve high aspect ratio interconnects.

In an exemplary embodiment, modified reflow process 3700 ramps up to a maximum temperature slightly exceeding the melting point of a solder (for example, within about 10 degrees Celsius over the melting point of a solder) over a period of between about 60 minutes and about 80 minutes. In an exemplary embodiment wherein a particular solder is utilized, modified reflow process 3700 ramps up to a temperature of about 185 degrees Celsius. In another exemplary embodiment wherein a different solder is utilized, modified reflow process 3700 ramps up to a temperature of about 200 degrees Celsius. It will be appreciated that various solder compositions have various melting points; as such, the selected maximum temperature for modified reflow process 3700 may vary depending on the solder composition utilized.

In various exemplary embodiments, modified reflow process 3700 allows sufficient time for the flux to mostly and/or fully evaporate during the reflow time. Moreover, modified flux reflow process 3700 also provides adequate time for the solder particulates to merge and melt. In an exemplary embodiment, modified reflow process 3700 is configured with a temperature increase of about 2 degrees Celsius per minute. In various exemplary embodiments, modified reflow process 3700 is configured with a temperature increase of between about 1.6 degrees Celsius per minute and about 2.4 degrees Celsius per minute. In an exemplary embodiment, modified reflow process 3700 is configured to generally linearly increase temperature between about room temperature and about 185 degrees Celsius over a period of between about 60 minutes and about 80 minutes. Moreover, in various exemplary embodiments, modified reflow process 3700 is configured to generally linearly increase temperature between about room temperature and a chosen maximum temperature over a period of between about 60 minutes and about 80 minutes.

It will be appreciated that, in various exemplary embodiments, the rate of temperature increase in modified reflow process 3700 is configured to facilitate maintaining high aspect ratio interconnects. Additionally, the rate of temperature increase in modified reflow process 3700 is configured to reduce and/or prevent the solder from becoming brittle and/or dry, and thus reduce the attendant electrical and/or mechanical shortcomings associated with brittle and/or dry solder. Additionally, in various exemplary embodiments, modified reflow process 3700 facilitates creation of solder bumps with significantly reduced and/or eliminated surface contamination, as the flux is allowed to at least partially evaporate rather than remaining as residue after reflow and contaminating the surface.

After application of an exemplary modified reflow process 3700, visual observations under a microscope as well as SEM imaging indicate little to no spill-over of flux or contamination around the solder bump, making it safe for active MEMS mechanical structures. In certain instances, a very thin layer of flux extending approximately 20 µm to about 50 µm from the bump boundaries may be observed. It is noted that the shape of the solder bump after modified reflow process 3700 is often not significantly different from the shape before reflow. Additionally, the grain boundary of the solder particulate is typically revealed.

By utilizing modified reflow process 3700 instead of a conventional reflow process, bond pads may be located closer to active MEMS structures without contamination, for example as close as about 150 µm, as close as about 100 µm, or even as close as about 75 µm. Moreover, by utilizing interconnect fabrication techniques disclosed herein (e.g., dip and attach technique 3470; dispense technique 3580; and/or dispense, pull, and attach technique 3690) high aspect ratio interconnects may be fabricated—for example, interconnects having an aspect ratio greater than one, interconnects having an aspect ratio greater than two, and/or the like.

Additionally, by utilizing modified reflow process 3700, interconnects fabricated with one or more of the interconnection techniques disclosed herein (e.g., dip and attach technique 3470; dispense technique 3580; and/or dispense, pull, and attach technique 3690), changes in the height of the interconnects during reflow can be reduced. In an exemplary embodiment, modified reflow process 3700 reduced the height of interconnects by less than 40%. In other exemplary embodiments, modified reflow process 3700 reduced the height of interconnects by between about 30% and about 60%.

Figure 38A:
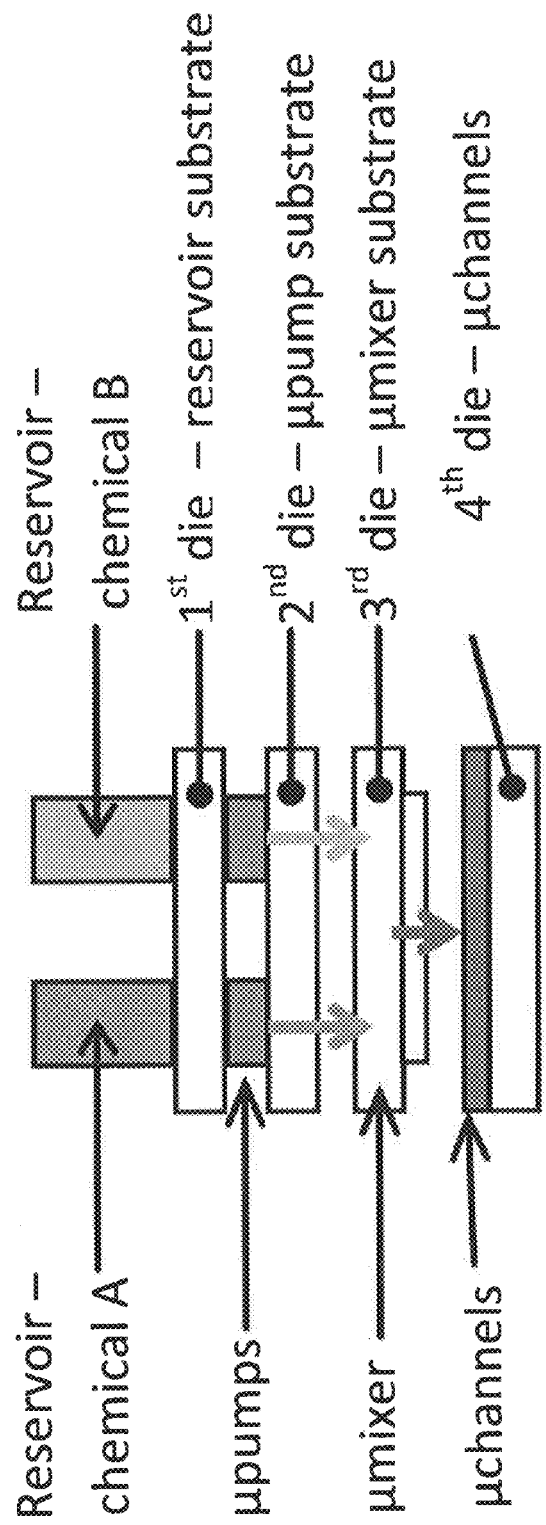
FIG. 38A illustrates a flip-chip stack to integrate multiple MEMS microfluidic devices in accordance with an exemplary embodiment.

Turning now to FIGS. 38A and 38B, in accordance with principles of the present disclosure, interconnects may be utilized which have multiple functionalities. For example, in various exemplary embodiments micro-bumps having simultaneous mechanical, electrical, and micro-fluidic connective properties may be utilized.

The growing research and development in the area of MEMS microfluidics create a new opportunity and a desire to integrate microfluidic components such as microchannels, microvalves, micromixers, micropumps, and ASIC (Application Specific Integrated Circuits) into an integrated system. The integration of MEMS microfluidics devices with ASICs on a monolithic die faces very complex and multidisciplinary challenges, such as foundry process compatibility, which lead to design constraints between two or more microfluidic devices as the monolithic die design typically needs to have compatible design rules. Monolithic integration often limits the design enhancement of the MEMS device in general, the problem is generally worse for MEMS microfluidics because two or more microfluidic devices are often designed and microfabricated on separate dies with different design guidelines and foundry processes.

Often, MEMS microfluidics components are integrated through non-microfabricated external microtubing that link one microfluidic die/substrate to another. This type of ad-hoc integration technology often makes the whole system bulky and inefficient in term of space and functionality, and exacerbates the problems with quality and efficacy of the MEMS devices, thus reducing the motivation for using MEMS technology in the first place.

Additionally, the integration of microfluidic components on one planar substrate as multi-chips on a package (MCP) or systems on package (SoP) has been a promising approach to integrate microelectronics and/or microfluidic MEMS devices. However, MCP or SoP technology faces a variety of challenges such as microfluidically connecting/linking the MEMS dies efficiently without significantly adding additional pressure gradients. Furthermore, MCP and SoP design often creates a large footprint for the integrated system, which may defeat the purpose of using MEMS or microfabrication technology at all.

3D flip-chip stacks can offer a convenient, chip-scale approach to integrate MEMS microfluidics devices efficiently. 3D stacks typically comprise multiple dies that are mechanically and electrically connected to one another in 3D fashion, for example using TSV (through-silicon vias), interposers, and micro-bumping First Level Interconnects (FLI).

In accordance with principles of the present disclosure, innovative 3D stacks for MEMS microfluidics are enabled. These 3D stacks offer tremendous advantages, such as a) shorter fluidic pathways—micropumps and microchannels can be stacked on top of one another, b) compact and efficient packaging design, and c) the ability to electrically connect ASIC device with MEMS microfluidic through FLI microbumps. Moreover, principles of the present disclosure contemplate compact and efficient microfluidic FLI to support the development of high density 3D stacks of MEMS microfluidics integration. This micro-bump has 3 functionalities (MB3F)—simultaneous microfluidic, electrical, and mechanical interconnects between one die to another die/substrate. The combination of three functionalities provides a compact and efficient flip-chip FLI bumping technology for MEMS microfluidics design, without necessarily adding extra area in the die/substrate level for separate microfluidic and electrical interconnects.

In accordance with an exemplary embodiment, and with reference now to FIG. 38A, a schematic of exemplary 3D stack integration of microfluidic devices using MB3F is disclosed. 3D stacks create more compact and efficient microfluidic integration as the microfluidic devices (reservoirs, micropumps, micro-mixer, microchannels, etc) can be connected to one another vertically, removing the unnecessary fluidic pathway along the planar/horizontal direction. Moreover, 3D stacks can potentially reduce the power consumption of the micropumps and micropumps with lower pressure heads can be used.

Turning now to FIG. 38B, in various exemplary embodiments micro-bumps having simultaneous mechanical, electrical, and micro-fluidic connective properties may be created via a "dip and rotate" technique 3820. In an exemplary embodiment, dip and rotate technique 3820 may be accomplished via utilizing a dispensing tip 3854 having an outer diameter of about 240 μm, an Ag conductive epoxy (for example, E3001 available from Epoxy Technology, Billerica, Mass.), and a Cu-plated pad with a center orifice.

In an exemplary embodiment, dip and rotate technique 3820 comprises dipping a dispensing tip 3854 needle into a bath of suitable material (for example, Ag epoxy), until a suitable amount (for example, approximately $7.2 \times 10^{-3}$ mm$^3$) of Ag epoxy 3853 is attached to dispensing tip 3854 (step 3822). Dispensing tip 3854 is brought close to Cu pad 3855 until some amount of Ag epoxy touches Cu pad 3855 (for example, approximately 50 μm distance between the top surface of the pad to the bottom surface dispensing tip 3854) (step 3824). Dispensing tip 3854 is then slowly rotated (for example, along the center line of the outer circular pad concentric to the orifice) to form an Ag epoxy wall on the circumference of the pad (step 3826). In an exemplary embodiment, one dip of Ag epoxy covers about ¼ of the circumference of the pad; therefore, in this exemplary embodiment four repetitions of any combination of steps 3822 through 3826 may be utilized to fully cover the pad circumference; fewer or more repetitions may also be utilized, as suitable. Dispensing tip 3854 may then be removed (step 3828), and the substrate is heated, for example on a hot plate at 120 degrees Celsius for 60 seconds.

Figure 39A:
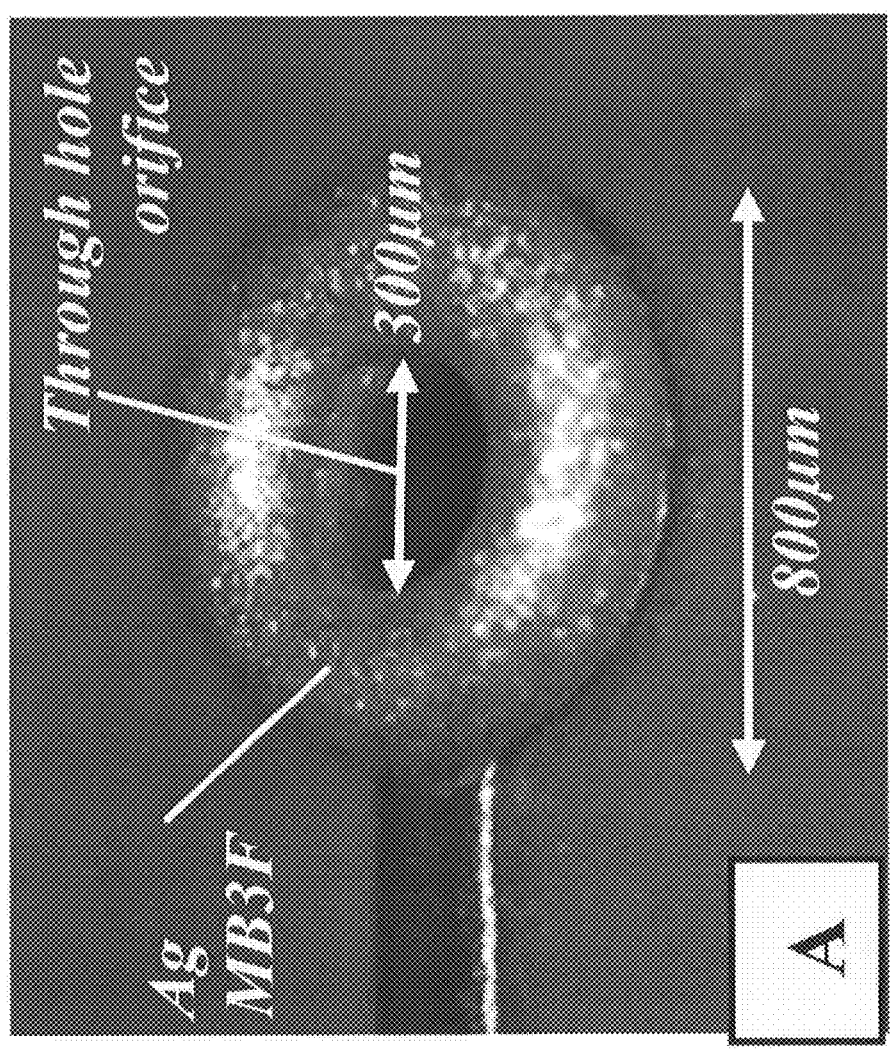
FIG. 39A is a micrograph of an exemplary MB3F interconnect in accordance with an exemplary embodiment.

Turning now to FIG. 39A, an exemplary Ag MB3F bump patterned on a Cu plated electrical pad on a PCB substrate with the thickness of 1.5 mm is illustrated. This exemplary Ag MB3F bump has a centered orifice with an inner diameter of about 300 μm. This orifice is a through-hole to the other side of the substrate. The outer diameter of the bump is about 800 μm, which covers the width of the Cu pad underneath. The thickness of the Ag MB3F bump is about 290 μm not including the thickness of the Cu pad (about 50 μm). This exemplary MB3F bump was constructed by using 6 repetitions of dip and rotate technique 3820 as disclosed above.

Figure 39B:
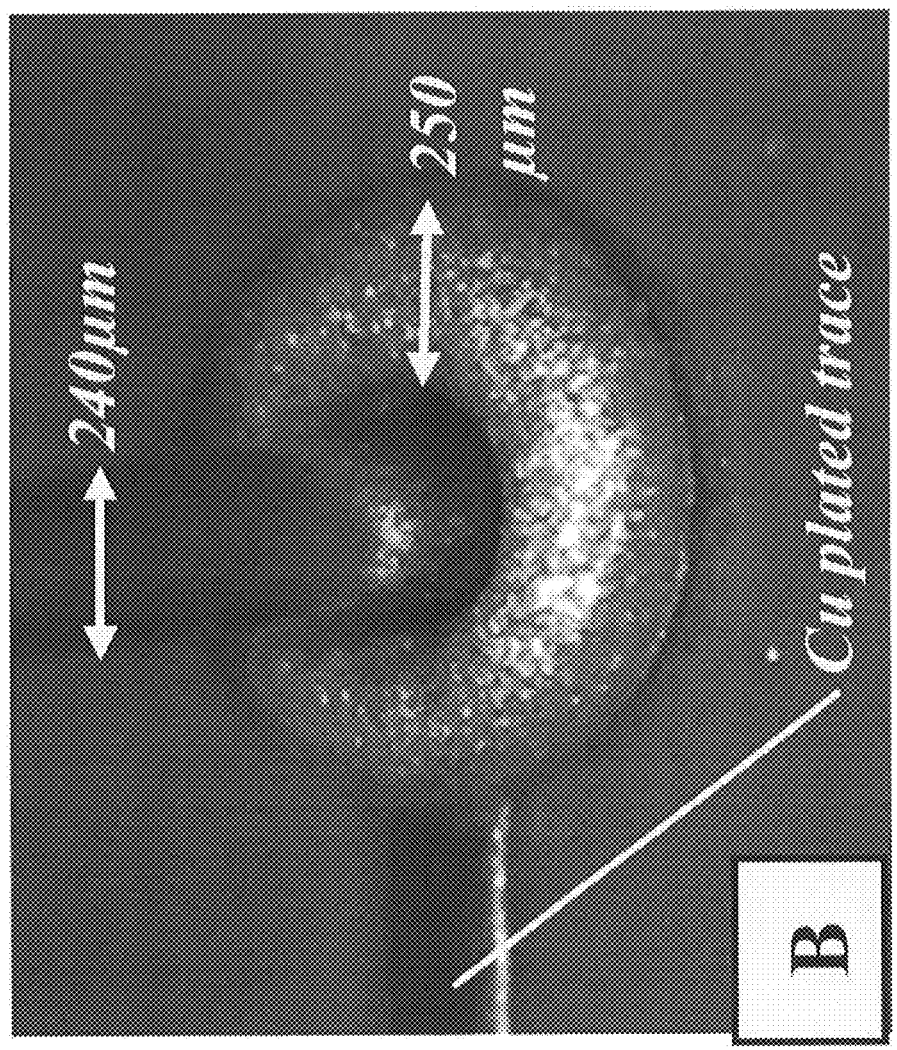
FIG. 39B is a micrograph of an exemplary MB3F interconnect, showing a nozzle inserted through the center orifice in accordance with an exemplary embodiment.
Figure 39C:
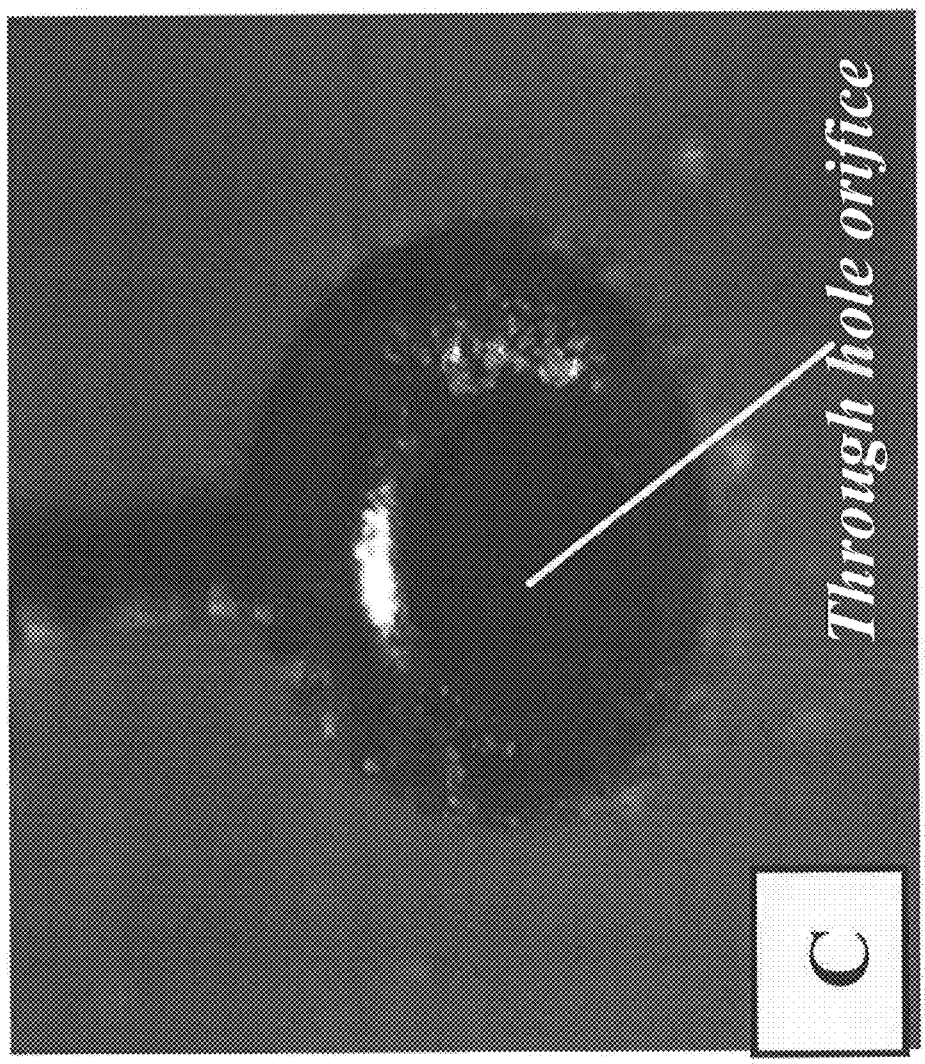
FIG. 39C is a micrograph of an exemplary MB3F interconnect, illustrating the uncontaminated backside in accordance with an exemplary embodiment.
Figure 39D:
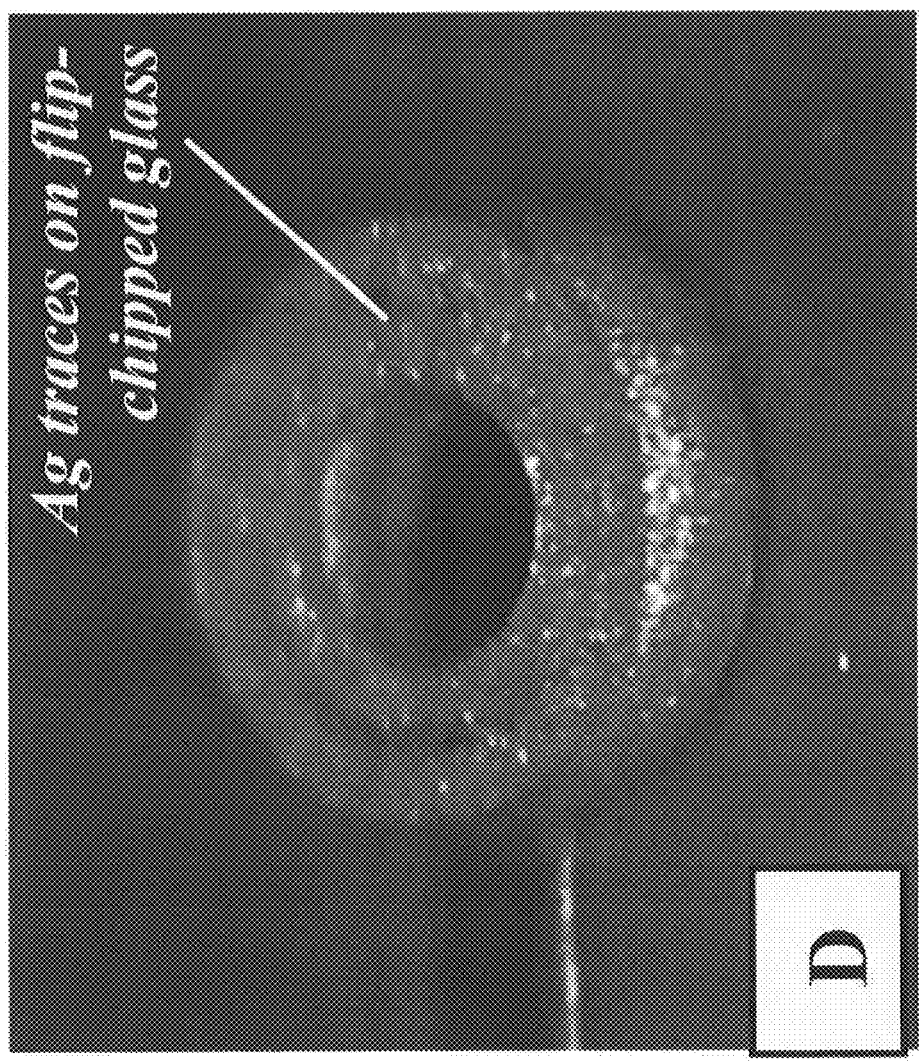
FIG. 39D is a micrograph of an exemplary MB3F interconnect, illustrating a glass flip-chipped on top in accordance with an exemplary embodiment.

Visual examination under a microscope shows no contamination from dip and rotate technique 3820 on the surface of the through-hole. A nozzle with 240 μm OD can be freely inserted in and out the orifice as depicted in FIG. 39B. The pad on the other side of the PCB remains clean and uncontaminated during dip and rotate technique 3820 as shown in FIG. 39C. As illustrated in FIG. 39D, in an exemplary embodiment a glass substrate (for example, about 0.5 mm thick) may be flip-chipped on top of the MB3F bump to mimic the real functionality of this bump as a packaging interconnect as shown in FIG. 39D. No adhesion material is needed for dip and rotate technique 3820 because the Ag bump adheres well to a variety of surfaces including aluminum (CMOS standard metallization), plastic, and glass. In an exemplary embodiment, shearing tests of MB3F bumps on glass substrates show shear strength of more than 50 MPa, which is significantly higher than typical shear strength of Pb-based solder bumps of about 39 MPa.

In accordance with various exemplary embodiments, taller bump heights can be achieved by repeating the steps of dip and rotate technique 3820. For example, bumps with a height of about 380 μm can be achieved by using 8 repetitions of dip and rotate technique 3820. Taller bumps provide advantages for MEMS, because some MEMS out-of-plane microactuators and microstructures require sufficient clearance between the die and the substrate for optimal functionality.

In an exemplary embodiment, breakdown pressure of a MB3F bump to function as microfluidic interconnect may be tested by flowing water through the orifice hole. In various exemplary embodiments, water tests at a pressure of more than 30 kPa showed no leakage from the MB3F bump joints.

In certain exemplary embodiments, if a non-dielectric fluid is used (such as water), an inert, biocompatible, and conformal coating (for example, Parylene C with the thickness of 1 μm) is suggested to be applied throughout the channels post-integration to insulate the fluid from the electrical current in the MB3F bump. The processes to make MB3F as illustrated in FIG. 38B do not require clean-room resources (for example, a class>10,000 cleanroom environment is adequate), and can be completed either at the die or wafer level after the entire front-end and back-end processes of the ASIC/MEMS are completed. Dip and rotate technique 3820 is simple, scalable, and does not require an additional surface micromachining step to be added to an ASIC/MEMS foundry process.

In an exemplary embodiment, a microfluidic device comprises a first substrate, and a second substrate coupled to the first substrate via a flip-chip interconnect, wherein the flip-chip interconnect provides simultaneous mechanical, electrical, and microfluidic connections between the first substrate and the second substrate. The flip-chip interconnect may be formed via a dip and rotate technique.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection. When language similar to "at least one of A, B, or C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method for forming electronic interconnects, the method comprising:
    dipping a needle into a metal epoxy to cover the tip of the needle with the metal epoxy;
    retrieving the needle from the metal epoxy with a small amount of the metal epoxy on the tip of the needle;
    moving the needle close to a bond pad to cause the metal epoxy to attach to the bond pad; and
    moving the needle away from the bond pad to leave a bump of metal epoxy on the bond pad.

2. The method of claim 1, further comprising repeating the dipping the needle, retrieving the needle, moving the needle close to the bond pad, and moving the needle away from the bond pad to increase an aspect ratio of the bump of metal epoxy.

3. The method of claim 1, wherein the bond pad is less than 100 μm by 100 μm in size, and wherein the bump does not extend more than 25 μm beyond an edge of the bond pad.

4. The method of claim 2, wherein the bond pad is 100 μm by 100 μm in size, and wherein the bump of the metal epoxy has a height exceeding 110 μm.

5. A method for forming electronic interconnects, the method comprising:
    moving a dispensing tip within 50 μm of the surface of a bond pad;
    dispensing solder paste from the dispensing tip;
    moving the dispensing tip away from the bond pad to leave a bump of solder paste on the bond pad; and
    repeating the moving the dispensing tip, dispensing solder paste, and moving the dispensing tip away from the bond pad to increase the aspect ratio of the bump of solder paste.

6. The method of claim 5, wherein the bump has an aspect ratio greater than one after reflowing.

7. The method of claim 5, wherein flux residue extends no more than 50 μm from an edge of the bond pad after reflowing.

8. A method for forming electronic interconnects, the method comprising:
    selecting a first surface, wherein the first surface is not a bond pad;
    moving a dispensing tip within 50 μm of the first surface;
    dispensing solder paste from the dispensing tip via a first pulse;
    moving the dispensing tip away from the first surface while dispensing solder paste from the dispensing tip, to form a rod of solder paste extending from and attached to the dispensing tip;
    moving the dispensing tip to bring the rod of solder paste in contact with a bond pad; and
    moving the dispensing tip away from the bond pad to leave a bump of solder paste on the bond pad.

9. The method of claim 8, wherein the bump of solder paste has an aspect ratio greater than two prior to reflowing.

10. The method of claim 8, wherein the bump of solder paste has an aspect ratio greater than three prior to reflowing.

11. The method of claim 9, further comprising reflowing the solder paste to form an interconnect, wherein flux residue extends no more than 50 μm from an edge of the bond pad after the reflowing.

12. A method for reflowing solder paste, the method comprising:
    forming a bump of solder paste on a bond pad; and
    heating the bump to a temperature exceeding a melting temperature of the solder paste over a period between 60 minutes and 80 minutes,
    wherein the heating causes the bump of solder paste to increase in temperature at a rate between 1.6 degrees Celsius per minute and 2.4 degrees Celsius per minute,
    wherein the bump of solder paste has an aspect ratio greater than one after the heating, and
    wherein flux residue extends no more than 50 μm from an edge of the bond pad after the heating.

13. The method of claim 12, wherein the heating changes the height of the bump of solder paste by less than 40 percent.

* * * * *